(12) United States Patent
Van De Ven et al.

(10) Patent No.: US 8,310,143 B2
(45) Date of Patent: Nov. 13, 2012

(54) LIGHTING DEVICE AND LIGHTING METHOD

(75) Inventors: Antony Paul Van De Ven, Sai Kung (HK); Gerald H. Negley, Durham, NC (US)

(73) Assignee: Cree, Inc., Durham, NC (US)

( * ) Notice: Subject to any disclaimer, the term of this patent is extended or adjusted under 35 U.S.C. 154(b) by 130 days.

(21) Appl. No.: 11/843,243

(22) Filed: Aug. 22, 2007

(65) Prior Publication Data
US 2008/0084685 A1    Apr. 10, 2008

Related U.S. Application Data

(60) Provisional application No. 60/839,453, filed on Aug. 23, 2006.

(51) Int. Cl.
*H01J 1/62* (2006.01)
*H01J 63/04* (2006.01)
(52) U.S. Cl. ......... 313/501; 313/498; 313/502; 313/512
(58) Field of Classification Search ................. 313/498, 313/501, 502, 512
See application file for complete search history.

(56) References Cited

U.S. PATENT DOCUMENTS

| | | | |
|---|---|---|---|
| 4,346,275 A | 8/1982 | Ieakiri et al. | |
| 4,476,620 A | 10/1984 | Ohki et al. | |
| 4,865,685 A | 9/1989 | Palmour | |
| 4,902,356 A | 2/1990 | Noguchi et al. | |
| 4,912,532 A | 3/1990 | Cook et al. | |
| 4,918,497 A | 4/1990 | Edmond | |
| 4,946,547 A | 8/1990 | Palmour et al. | |
| 4,966,862 A | 10/1990 | Edmond | |
| 4,981,551 A | 1/1991 | Palmour | |
| 5,027,168 A | 6/1991 | Edmond | |
| 5,087,949 A | 2/1992 | Haitz et al. | |
| 5,103,271 A | 4/1992 | Izumiya et al. | |
| 5,200,022 A | 4/1993 | Kong et al. | |
| 5,210,051 A | 5/1993 | Carter, Jr. | |

(Continued)

FOREIGN PATENT DOCUMENTS

EP    0 684 648    11/1995

(Continued)

OTHER PUBLICATIONS

American Handbook of Physics Handbook, 3rd Edition, McGraw-Haill, Ed: Dwight E. Gray, 1972.

(Continued)

*Primary Examiner* — Nimeshkumar Patel
*Assistant Examiner* — Thomas A Hollweg
(74) *Attorney, Agent, or Firm* — Burr & Brown

(57) ABSTRACT

A lighting device comprising at least one solid state light emitter and at least one lumiphor. If each solid state light emitter is illuminated and each lumiphor is excited, a mixture of light emitted has x, y color coordinates within an area defined by the coordinates 0.32, 0.40; 0.36, 0,48; 0.43, 0.45; 0.42, 0.42; and 0.36, 0.38. The lumiphor(s) comprises phosphor particles, in the range of from 3 to 7 micrometers (or 5-15, 10-20, or 15-25 micrometers), or having a mean particle size of 5, 10, 15, 20 micrometers. Also, a lighting device comprising at least one emitter and at least one lumiphor in which the lumiphor comprises phosphor particles having sizes as mentioned above, where the lighting device has an efficacy of at least 60 (or 70, or 80) lumens per watt.

58 Claims, 9 Drawing Sheets

U.S. PATENT DOCUMENTS

| | | | |
|---|---|---|---|
| 5,338,944 A | 8/1994 | Edmond et al. | |
| 5,376,241 A | 12/1994 | Shor et al. | |
| 5,376,580 A | 12/1994 | Kish et al. | |
| RE34,861 E | 2/1995 | Davis et al. | |
| 5,393,993 A | 2/1995 | Edmond et al. | |
| 5,416,342 A | 5/1995 | Edmond et al. | |
| 5,502,316 A | 3/1996 | Kish et al. | |
| 5,523,589 A | 6/1996 | Edmond et al. | |
| 5,604,135 A | 2/1997 | Edmond et al. | |
| 5,631,190 A | 5/1997 | Negley | |
| 5,644,156 A | 7/1997 | Suzuki et al. | |
| 5,739,554 A | 4/1998 | Edmond et al. | |
| 5,779,924 A | 7/1998 | Krames et al. | |
| 5,803,579 A | 9/1998 | Turnbull et al. | |
| 5,912,477 A | 6/1999 | Negley | |
| 5,939,732 A | 8/1999 | Kurtz et al. | |
| 5,959,316 A | 9/1999 | Lowery | |
| 5,985,687 A | 11/1999 | Bowers et al. | |
| 6,043,509 A | 3/2000 | Kurihara et al. | |
| 6,071,795 A | 6/2000 | Cheung et al. | |
| 6,120,600 A | 9/2000 | Edmond et al. | |
| 6,132,072 A | 10/2000 | Turnbull et al. | |
| 6,153,971 A | 11/2000 | Shimizu et al. | |
| 6,180,029 B1 * | 1/2001 | Hampden-Smith et al. | 252/301.4 R |
| 6,187,606 B1 | 2/2001 | Edmond et al. | |
| 6,201,262 B1 | 3/2001 | Edmond et al. | |
| 6,212,213 B1 | 4/2001 | Weber et al. | |
| 6,225,647 B1 | 5/2001 | Kurtz et al. | |
| 6,234,648 B1 | 5/2001 | Borner et al. | |
| 6,258,699 B1 | 7/2001 | Chang et al. | |
| 6,274,924 B1 | 8/2001 | Carey et al. | |
| 6,303,405 B1 | 10/2001 | Yoshida et al. | |
| 6,329,676 B1 | 12/2001 | Takayama et al. | |
| 6,365,429 B1 | 4/2002 | Kneissl et al. | |
| 6,410,942 B1 | 6/2002 | Thibeault et al. | |
| 6,420,199 B1 | 7/2002 | Coman et al. | |
| 6,420,242 B1 | 7/2002 | Cheung et al. | |
| 6,429,460 B1 | 8/2002 | Chen et al. | |
| 6,448,102 B1 | 9/2002 | Kneissl et al. | |
| 6,465,809 B1 | 10/2002 | Furukawa et al. | |
| 6,468,824 B2 | 10/2002 | Chen et al. | |
| 6,501,102 B2 * | 12/2002 | Mueller-Mach et al. | 257/84 |
| 6,504,180 B1 | 1/2003 | Heremans et al. | |
| 6,513,949 B1 | 2/2003 | Marshall et al. | |
| 6,538,371 B1 | 3/2003 | Duggal et al. | |
| 6,550,949 B1 | 4/2003 | Bauer et al. | |
| 6,552,495 B1 | 4/2003 | Chang | |
| 6,559,075 B1 | 5/2003 | Kelly et al. | |
| 6,562,648 B1 | 5/2003 | Wong et al. | |
| 6,577,073 B2 | 6/2003 | Shimizu et al. | |
| 6,607,931 B2 | 8/2003 | Streubel | |
| 6,657,236 B1 | 12/2003 | Thibeault et al. | |
| 6,677,173 B2 | 1/2004 | Ota | |
| 6,692,136 B2 | 2/2004 | Marshall et al. | |
| 6,716,654 B2 | 4/2004 | Hsu et al. | |
| 6,740,604 B2 | 5/2004 | Kelly et al. | |
| 6,757,314 B2 | 6/2004 | Kneissl et al. | |
| 6,784,463 B2 | 8/2004 | Camras et al. | |
| 6,786,390 B2 | 9/2004 | Yang et al. | |
| 6,800,500 B2 | 10/2004 | Coman et al. | |
| 6,806,112 B1 | 10/2004 | Horng et al. | |
| 6,809,341 B2 | 10/2004 | Hsu et al. | |
| 6,809,347 B2 | 10/2004 | Tasch et al. | |
| 6,817,735 B2 | 11/2004 | Shimizu et al. | |
| 6,841,804 B1 | 1/2005 | Chen et al. | |
| 6,846,686 B2 | 1/2005 | Saeki et al. | |
| 6,849,878 B2 | 2/2005 | Bader et al. | |
| 6,884,647 B2 | 4/2005 | Sakai et al. | |
| 6,914,267 B2 | 7/2005 | Fukasawa et al. | |
| 6,936,857 B2 | 8/2005 | Doxsee et al. | |
| 6,972,438 B2 | 12/2005 | Li et al. | |
| 7,005,679 B2 | 2/2006 | Tarsa et al. | |
| 7,008,078 B2 | 3/2006 | Shimizu et al. | |
| 7,014,336 B1 | 3/2006 | Ducharme et al. | |
| 7,061,454 B2 | 6/2006 | Sasuga et al. | |
| 7,066,623 B2 | 6/2006 | Lee et al. | |
| 7,084,435 B2 | 8/2006 | Sugimoto et al. | |
| 7,095,056 B2 | 8/2006 | Vitta et al. | |
| 7,144,121 B2 | 12/2006 | Minano et al. | |
| 7,195,944 B2 | 3/2007 | Tran et al. | |
| 7,213,940 B1 | 5/2007 | Van De Ven et al. | |
| 7,258,818 B2 * | 8/2007 | Sakata et al. | 252/301.4 F |
| 7,365,485 B2 | 4/2008 | Fukasawa et al. | |
| 7,473,934 B2 | 1/2009 | Nagai et al. | |
| 7,656,371 B2 | 2/2010 | Shimizu et al. | |
| 2002/0068201 A1 | 6/2002 | Vaudo et al. | |
| 2002/0123164 A1 | 9/2002 | Slater, Jr. et al. | |
| 2002/0139990 A1 | 10/2002 | Suehiro et al. | |
| 2002/0153835 A1 | 10/2002 | Fujiwara et al. | |
| 2002/0163302 A1 | 11/2002 | Nitta et al. | |
| 2003/0006418 A1 | 1/2003 | Emerson et al. | |
| 2003/0030063 A1 | 2/2003 | Sosniak et al. | |
| 2003/0067773 A1 | 4/2003 | Marshall et al. | |
| 2003/0146411 A1 | 8/2003 | Srivastava et al. | |
| 2003/0173602 A1 | 9/2003 | Hsu et al. | |
| 2004/0051111 A1 | 3/2004 | Ota et al. | |
| 2004/0056260 A1 | 3/2004 | Slater, Jr. et al. | |
| 2004/0070004 A1 | 4/2004 | Eliashevich et al. | |
| 2004/0072382 A1 | 4/2004 | Kelly et al. | |
| 2004/0094774 A1 | 5/2004 | Steigerwald et al. | |
| 2004/0105261 A1 | 6/2004 | Ducharme et al. | |
| 2004/0188697 A1 | 9/2004 | Brunner et al. | |
| 2004/0217364 A1 | 11/2004 | Tarsa et al. | |
| 2005/0082562 A1 | 4/2005 | Ou et al. | |
| 2005/0082974 A1 | 4/2005 | Fukasawa et al. | |
| 2005/0093442 A1 * | 5/2005 | Setlur et al. | 313/512 |
| 2005/0133808 A1 | 6/2005 | Uraya et al. | |
| 2005/0151138 A1 | 7/2005 | Slater, Jr. et al. | |
| 2005/0215000 A1 | 9/2005 | Negley | |
| 2005/0227379 A1 | 10/2005 | Donofrio | |
| 2005/0285494 A1 | 12/2005 | Cho et al. | |
| 2006/0012989 A1 | 1/2006 | Lee | |
| 2006/0061259 A1 | 3/2006 | Negley | |
| 2006/0063289 A1 | 3/2006 | Negley et al. | |
| 2006/0105478 A1 * | 5/2006 | Camras et al. | 438/22 |
| 2006/0105482 A1 | 5/2006 | Alferink et al. | |
| 2006/0180818 A1 | 8/2006 | Nagai et al. | |
| 2007/0001188 A1 | 1/2007 | Lee | |
| 2007/0120496 A1 | 5/2007 | Shimizu et al. | |

FOREIGN PATENT DOCUMENTS

| | | |
|---|---|---|
| EP | 1 059 667 | 12/2000 |
| EP | 1 156 020 | 11/2001 |
| EP | 1 246 266 | 10/2002 |
| EP | 1 263 058 | 12/2002 |
| EP | 1 345 275 | 9/2003 |
| EP | 1 662 583 | 5/2006 |
| JP | 61-059886 | 3/1986 |
| JP | 07-007179 | 10/1995 |
| JP | 10-163535 | 6/1998 |
| JP | 11-238913 | 8/1999 |
| JP | 2002-057376 | 2/2002 |
| JP | 2003-515956 | 5/2003 |
| JP | 2003-529889 | 10/2003 |
| JP | 2004-080046 | 3/2004 |
| JP | 2004-103443 | 4/2004 |
| JP | 2004-356116 | 12/2004 |
| JP | 2005-142311 | 6/2005 |
| JP | 2006-013416 | 1/2006 |
| JP | 2006-152254 | 6/2006 |
| WO | 01/41215 | 6/2001 |
| WO | 01/69692 | 9/2001 |
| WO | 03/005458 | 1/2003 |
| WO | 03/010832 | 2/2003 |
| WO | 2005/011006 | 2/2005 |
| WO | 2005/013365 | 2/2005 |
| WO | 2005/104253 | 11/2005 |
| WO | WO 2005/124877 | 12/2005 |
| WO | 2006/121196 | 1/2006 |
| WO | 2006-028312 | 3/2006 |

OTHER PUBLICATIONS

Kasugai et al., *Moth-Eye Light-Emitting Diodes*, Mater Res. Soc. Symp. Proc. vol. 831, 2005, Material Research Society, pp. E1.9.1-E1.9.6.

Kelner, G., et al., *Plasma Etching of BETA-SiC*, Journal of the Electrochemical Society, Manchester, New Hampshire, U.S. vol. 134, No. 1, Jan. 1987, pp. 253-254.

Khan, F.A., et al., *High Rate Etching of SiC Using Inductively Coupled Plasma Reactive Ion Etching in SF6-Based Gas Mixtures*, Applied Physics Letters, AIP, American Institute of Physics, Melville, NY, US, vol. 75, No. 15, Oct. 11, 1999, pp. 2268-2270.

Lagoubi et al., *Conditioning of N-Silicon by Photoelectrochimical Etching for Photovoltaic Application*, Proc. of the 11th E.C. Photovoltaic Solar Energy Conference, Oct. 12, 1992-Oct. 16, 1992, pp. 250-253, XP008043956, pp. 252-253, Fig. 8.

Lin et al., *Design and Fabrication of Omnidirectional Reflectors in the Visible Range*, Journal of Modern Otpics, vol. 52, No. 8, May 2005, pp. 1155-1160.

Mimura et al., *Blue Electroluminescence from Pourous Silicon Carbide*, Appl. Phys. Lett 65(26), Dec. 26, 1994, pp. 3350-3352.

Nichia, White LED, Part Nos. NSPW300BS, "Specifications for Nichia White LED, Model NSPW300BS," Nichia Corporation, Jan. 12, 2004.

Nichia, White LED, Part Nos. NSPW312BS, "Specifications for Nichia White LED, Model NSPW312BS," Nichia Corporation, Jan. 14, 2004.

Palmour, J.W., et al., *Crystallographic Etching Phenomenon during Plasma Etching of SiC (100) Thin Films in SF6*, Journal of the Electrochemical Society, Electrochemical Society, Manchester, N Hampshire, U.S., vol. 136, No. 2, Feb. 1, 1989, pp. 491-495.

Perrin et al., *Left-Handed Electromagnetism obtained via Nanostructured Metamaterials: Comparison with that from Microstructured Photonic Cyrstals*,Journal of Opics A: Pure and Applied Optics 7 (2005), S3-S11.

Schnitzer, et al., *30% External Quantum Efficieny from Surface Textured, Thin-Film Light-Emitting Diodes*, Applied Physics Lett. 63(16), Oct. 18, 1993, pp. 2174-2176.

Shor, et al., *Direct Observation of Porous SiC formed by Anodization in HF*, Appl. Phys. Lett. 62(22), May 31, 1993, pp. 2836-2838.

Streubel et al., *High Brightness AlGaInP Light-Emitting Diodes*, IEEE Journal on Selected Topis in Quantum Electronics, Vo. 8, Now. 2, Mar./Apr. 2002, pp. 321-332.

Windisch et al., *Non-Resonant Cavity Light-Emitting Diodes, In Light Emitting Diodes: Research Manufacturing, and Applications 1V*, H. Walter Yao et al., Proceding of SPIE vol. 3938 (2000), pp. 70-76.

Windisch, R., et al., "40% Efficient Thin-Film Surface-Textured Light-Emitting Diodes by Optimization of Natural Lithography," IEEE Transactions on Electron Devices, ISSN: 0018-9383, vol. 47 No. 7, Jul. 2000, pp. 1492-1498.

Windisch, R., et al., *Impact of Texture-Enhanced Transmission of High-Efficiency Surface-Textured Light-Emitting Diodes*, Applied Physics Letters, vol. 79, No. 15, Oct. 8, 2001, pp. 2315-2317.

Windisch, R., et al., *Light Extraction Mechanisms in High-Efficiency Surface-Textured Light-Emitting Diodes*, IEEE Journal on Selected Topics in Quantum Electronics, vol. 8, No. 2, Mar./Apr. 2002, pp. 248-255.

Zangooie et al., *Surface, Pore Morphology, and Optical Properties of Porous 4H-SiC*, Journal of the Electrochemical Society, 148(6) G297-G302 (2001), Jan. 9, 2001.

Boehlen et al., "Laser micro-machining of high density optical structures on large substrates," Proc. of SPIE vol. 5339, 2004, pp. 118-126.

U.S. Appl. No. 11/613,692, filed Dec. 20, 2006.
U.S. Appl. No. 11/614,180, filed Dec. 21, 2006.
U.S. Appl. No. 11/613,714, filed Dec. 20, 2006.
U.S. Appl. No. 11/624,811, filed Jan. 19, 2007.
U.S. Appl. No. 11/626,483, filed Jan. 24, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/736,761, filed Apr. 18, 2007.
U.S. Appl. No. 11/736,799, filed Apr. 18, 2007.
U.S. Appl. No. 11/755,153, filed May 30, 2007.
U.S. Appl. No. 11/856,421, filed Sep. 17, 2007.
U.S. Appl. No. 11/859,048, filed Sep. 21, 2007.
U.S. Appl. No. 11/939,047, filed Nov. 13, 2007.
U.S. Appl. No. 11/936,163, filed Nov. 7, 2007.
U.S. Appl. No. 11/948,021, filed Nov. 30, 2007.
U.S. Appl. No. 11/870,679, filed Oct. 11, 2007.
U.S. Appl. No. 11/951,626, filed Dec. 6, 2007.
U.S. Appl. No. 12/117,122, filed May 8, 2008.
U.S. Appl. No. 12/117,131, filed May 8, 2008.
U.S. Appl. No. 12/117,136, filed May 8, 2008.
U.S. Appl. No. 11/947,323, filed Nov. 29, 2007.
U.S. Appl. No. 12/035,604, filed Feb. 22, 2008.
U.S. Appl. No. 12/117,148, filed May 8, 2008.
U.S. Appl. No. 12/117,271, filed May 8, 2008.
U.S. Appl. No. 11/895,573, filed Aug. 24, 2007.
U.S. Appl. No. 11/835,044, filed Aug. 7, 2007.
U.S. Appl. No. 12/248,220, filed Oct. 9, 2008.
U.S. Appl. No. 12/277,745, filed Nov. 25, 2008.

Van de Ven et al., "Warm White Illumination with High CRI and High Efficacy by Combining 455 run Excited Yellowish Phosphor LEDs and Red AlInGaP LEDs", First International Conference on White LEDs and Solid State Lighting.

Crec® XLamp® 7090 XR-E Series LED Binning and Labeling.

\* cited by examiner

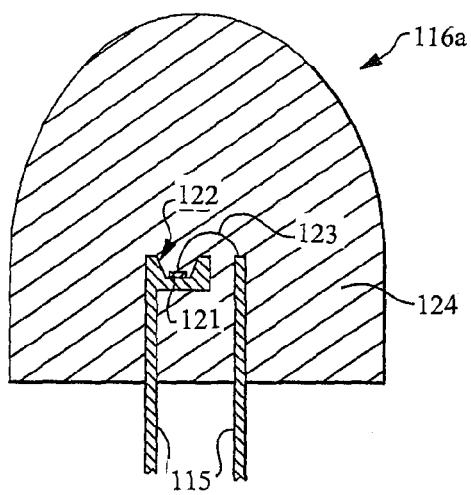
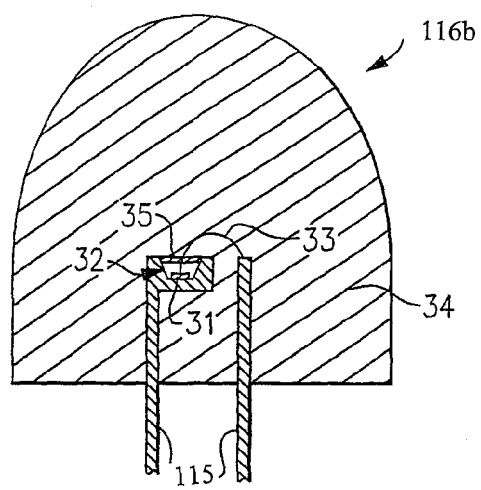
FIG. 8  FIG. 9

LIGHTING DEVICE AND LIGHTING METHOD

CROSS-REFERENCE TO RELATED APPLICATIONS

This application claims the benefit of U.S. Provisional Patent Application No. 60/839,453, filed Aug. 23, 2006, the entirety of which is incorporated herein by reference.

FIELD OF THE INVENTION

The present invention relates to a lighting device, in particular, a device which includes one or more light emitting diodes and one or more luminescent materials (e.g., one or more phosphors). The present invention is also directed to lighting methods.

BACKGROUND OF THE INVENTION

A large proportion (some estimates are as high as twenty-five percent) of the electricity generated in the United States each year goes to lighting. Accordingly, there is an ongoing need to provide lighting which is more energy-efficient. It is well-known that incandescent light bulbs are very energy-inefficient light sources—about ninety percent of the electricity they consume is released as heat rather than light. Fluorescent light bulbs are more efficient than incandescent light bulbs (by a factor of about 10) but are still less efficient than solid state light emitters, such as light emitting diodes.

In addition, as compared to the normal lifetimes of solid state light emitters, incandescent light bulbs have relatively short lifetimes, i.e., typically about 750-1000 hours. In comparison, light emitting diodes, for example, have typical lifetimes between 50,000 and 70,000 hours. Fluorescent bulbs have longer lifetimes (e.g., 10,000-20,000 hours) than incandescent lights, but provide less favorable color reproduction.

Color reproduction is typically measured using the Color Rendering Index (CRI Ra). CRI Ra is a modified average of the relative measurement of how the color rendition of an illumination system compares to that of a reference radiator when illuminating eight reference colors, i.e., it is a relative measure of the shift in surface color of an object when lit by a particular lamp. The CRI Ra equals 100 if the color coordinates of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80). Certain types of specialized lighting have very low CRI Ra (e.g., mercury vapor or sodium lamps have Ra as low as about 40 or even lower). Sodium lights are used, e.g., to light highways—driver response time, however, significantly decreases with lower CRI Ra values (for any given brightness, legibility decreases with lower CRI Ra).

Another issue faced by conventional light fixtures is the need to periodically replace the lighting devices (e.g., light bulbs, etc.). Such issues are particularly pronounced where access is difficult (e.g., vaulted ceilings, bridges, high buildings, traffic tunnels) and/or where change-out costs are extremely high. The typical lifetime of conventional fixtures is about 20 years, corresponding to a light-producing device usage of at least about 44,000 hours (based on usage of 6 hours per day for 20 years). Light-producing device lifetime is typically much shorter, thus creating the need for periodic change-outs.

Accordingly, for these and other reasons, efforts have been ongoing to develop ways by which light emitting diodes can be used in place of incandescent lights, fluorescent lights and other light-generating devices in a wide variety of applications. In addition, where light emitting diodes are already being used, efforts are ongoing to provide light emitting diodes which are improved, e.g., with respect to energy efficiency, color rendering index (CRI Ra), contrast, efficacy (1 m/W), and/or duration of service.

Light emitting diodes are well-known semiconductor devices that convert electrical current into light. A wide variety of light emitting diodes are used in increasingly diverse fields for an ever-expanding range of purposes.

More specifically, light emitting diodes are semiconducting devices that emit light (ultraviolet, visible, or infrared) when a potential difference is applied across a p-n junction structure. There are a number of well-known ways to make light emitting diodes and many associated structures, and the present invention can employ any such devices. By way of example, Chapters 12-14 of Sze, Physics of Semiconductor Devices, (2d Ed. 1981) and Chapter 7 of Sze, Modern Semiconductor Device Physics (1998) describe a variety of photonic devices, including light emitting diodes.

The commonly recognized and commercially available light emitting diode ("LED") that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477; various wire connections, and a package that encapsulates the light emitting diode.

As is well-known, a light emitting diode produces light by exciting electrons across the band gap between a conduction band and a valence band of a semiconductor active (light-emitting) layer. The electron transition generates light at a wavelength that depends on the band gap. Thus, the color of the light (wavelength) emitted by a light emitting diode depends on the semiconductor materials of the active layers of the light emitting diode.

Although the development of light emitting diodes has in many ways revolutionized the lighting industry, some of the characteristics of light emitting diodes have presented challenges, some of which have not yet been fully met. For example, the emission spectrum of any particular light emitting diode is typically concentrated around a single wavelength (as dictated by the light emitting diode's composition and structure), which is desirable for some applications, but not desirable for others, (e.g., for providing lighting, such an emission spectrum provides a very low CRI Ra).

Because light that is perceived as white is necessarily a blend of light of two or more colors (or wavelengths), no single light emitting diode junction has been developed that can produce white light. "White" light emitting diode lamps have been produced which have a light emitting diode pixel/cluster formed of respective red, green and blue light emitting diodes. Other "white" light emitting diode lamps have been produced which include (1) a light emitting diode which generates blue light and (2) a luminescent material (e.g., a phosphor) that emits yellow light in response to excitation by light emitted by the light emitting diode, whereby the blue light and the yellow light, when mixed, produce light that is perceived as white light.

In addition, the blending of primary colors to produce combinations of non-primary colors is generally well understood in this and other arts. In general, the 1931 CIE Chromaticity Diagram (an international standard for primary colors established in 1931), and the 1976 CIE Chromaticity Diagram (similar to the 1931 Diagram but modified such that similar distances on the Diagram represent similar perceived differences in color) provide useful reference for defining colors as weighted sums of primary colors.

Light emitting diodes can thus be used individually or in any combinations, optionally together with one or more luminescent material (e.g., phosphors or scintillators) and/or filters, to generate light of any desired perceived color (including white). Accordingly, the areas in which efforts are being made to replace existing light sources with light emitting diode light sources, e.g., to improve energy efficiency, color rendering index (CRI Ra), efficacy (1 m/W), and/or duration of service, are not limited to any particular color or color blends of light.

A wide variety of luminescent materials (also known as lumiphors or luminophoric media, e.g., as disclosed in U.S. Pat. No. 6,600,175, the entirety of which is hereby incorporated by reference) are well-known and available to persons of skill in the art. For example, a phosphor is a luminescent material that emits a responsive radiation (e.g., visible light) when excited by a source of exciting radiation. In many instances, the responsive radiation has a wavelength which is different from the wavelength of the exciting radiation. Other examples of luminescent materials include scintillators, day glow tapes and inks which glow in the visible spectrum upon illumination with ultraviolet light.

Luminescent materials can be categorized as being down-converting, i.e., a material which converts photons to a lower energy level (longer wavelength) or up-converting, i.e., a material which converts photons to a higher energy level (shorter wavelength).

Inclusion of luminescent materials in LED devices has been accomplished by adding the luminescent materials to a clear or substantially transparent encapsulant material (e.g., epoxy-based, silicone-based, glass-based or metal oxide-based material) as discussed above, for example by a blending or coating process.

For example, U.S. Pat. No. 6,963,166 (Yano '166) discloses that a conventional light emitting diode lamp includes a light emitting diode chip, a bullet-shaped transparent housing to cover the light emitting diode chip, leads to supply current to the light emitting diode chip, and a cup reflector for reflecting the emission of the light emitting diode chip in a uniform direction, in which the light emitting diode chip is encapsulated with a first resin portion, which is further encapsulated with a second resin portion. According to Yano '166, the first resin portion is obtained by filling the cup reflector with a resin material and curing it after the light emitting diode chip has been mounted onto the bottom of the cup reflector and then has had its cathode and anode electrodes electrically connected to the leads by way of wires. According to Yano '166, a phosphor is dispersed in the first resin portion so as to be excited with the light A that has been emitted from the light emitting diode chip, the excited phosphor produces fluorescence ("light B") that has a longer wavelength than the light A, a portion of the light A is transmitted through the first resin portion including the phosphor, and as a result, light C, as a mixture of the light A and light B, is used as illumination.

As noted above, "white LED lamps" (i.e., lights which emit light which is perceived as being white or near-white) have been investigated as potential replacements for white incandescent lamps. A representative example of a white LED lamp includes a package of a blue light emitting diode chip, made of indium gallium nitride (InGaN) or gallium nitride (GaN), coated with a phosphor such as YAG. In such an LED lamp, the blue light emitting diode chip produces an emission with a wavelength of about 450 nm, and the phosphor produces yellow fluorescence with a peak wavelength of about 550 nm on receiving that emission. For instance, in some designs, white light emitting diode lamps are fabricated by forming a ceramic phosphor layer on the output surface of a blue light-emitting semiconductor light emitting diode. Part of the blue ray emitted from the light emitting diode chip passes through the phosphor, while part of the blue ray emitted from the light emitting diode chip is absorbed by the phosphor, which becomes excited and emits a yellow ray. The part of the blue light emitted by the light emitting diode which is transmitted through the phosphor is mixed with the yellow light emitted by the phosphor. The viewer perceives the mixture of blue and yellow light as white light. Another type uses a blue or violet light emitting diode chip which is combined with phosphor materials that produce red or orange and green or yellowish-green light rays. In such a lamp, part of the blue or violet light emitted by the light emitting diode chip excites the phosphors, causing the phosphors to emit red or orange and yellow or green light rays. These rays, combined with the blue or violet rays, can produce the perception of white light.

As also noted above, in another type of LED lamp, a light emitting diode chip that emits an ultraviolet ray is combined with phosphor materials that produce red (R), green (G) and blue (B) light rays. In such an "RGB LED lamp", the ultraviolet ray that has been radiated from the light emitting diode chip excites the phosphor, causing the phosphor to emit red, green and blue light rays which, when mixed, are perceived by the human eye as white light. Consequently, white light can also be obtained as a mixture of these light rays.

Designs have been provided in which existing LED component packages and other electronics are assembled into a fixture. In such designs, a packaged LED is mounted to a circuit board or directly to a heat sink, the circuit board is mounted to a heat sink, and the heat sink is mounted to the fixture housing along with required drive electronics. In many cases, additional optics (secondary to the package parts) are also necessary.

In substituting light emitting diodes for other light sources, e.g., incandescent light bulbs, packaged LEDs have been used with conventional light fixtures, for example, fixtures which include a hollow lens and a base plate attached to the lens, the base plate having a conventional socket housing with one or more contacts which are electrically coupled to a power source. For example, LED light bulbs have been constructed which comprise an electrical circuit board, a plurality of packaged LEDs mounted to the circuit board, and a connection post attached to the circuit board and adapted to be connected to the socket housing of the light fixture, whereby the plurality of LEDs can be illuminated by the power source.

There is an ongoing need for ways to use solid state light emitters, e.g., light emitting diodes, to provide white light in a wider variety of applications, with greater energy efficiency, with improved color rendering index (CRI Ra), with improved efficacy (1 m/W), low cost and/or with longer duration of service.

BRIEF SUMMARY OF THE INVENTION

There is an ongoing need for a high efficiency white light source that combines the efficiency and long life of white solid state lamps, e.g., LED lamps (i.e., which avoids the use of relatively inefficient light sources) with an acceptable color temperature and good color rendering index, a wide gamut and simple control circuitry.

As described in U.S. Patent Application Ser. No. 60/793, 524, filed Apr. 20, 2006, the entirety of which is incorporated herein by reference, it has been found that particularly high CRI Ra can be obtained where solid state light emitters (e.g., LEDs) and lumiphors are selected such that if each of the solid state light emitters is illuminated and each of the lumiphors is excited, a mixture of light emitted from the solid state light emitters and the lumiphors would, in the absence of any additional light, have a mixed illumination having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

In addition, it has been found that in general, lumiphors which contain phosphor particles of larger sizes tend to make manufacturing more difficult, but produce less reflected light (and therefore higher first pass light extraction). It is believed that:

(1) lumiphors which contain phosphor particles having particles sizes in the range of from 3 to 7 micrometers, and in some cases, lumiphors in which at least 50 weight percent (in some cases 75 weight percent, and in some cases 90 weight percent) of the phosphor particles have particle sizes in the range of from about 3 micrometers to about 7 micrometers;

(2) lumiphors which contain phosphor particles having particles sizes in the range of from 5 to 15 micrometers, and in some cases, lumiphors in which at least 50 weight percent (in some cases 75 weight percent, and in some cases 90 weight percent) of the phosphor particles have particle sizes in the range of from about 5 micrometers to about 15 micrometers;

(3) lumiphors which contain phosphor particles having particles sizes in the range of from 10 to 20 micrometers, and in some cases, lumiphors in which at least 50 weight percent (in some cases 75 weight percent, and in some cases 90 weight percent) of the phosphor particles have particle sizes in the range of from about 10 micrometers to about 20 micrometers;

(4) lumiphors which contain phosphor particles having particles sizes in the range of from 15 to 25 micrometers, and in some cases, lumiphors in which at least 50 weight percent (in some cases 75 weight percent, and in some cases 90 weight percent) of the phosphor particles have particle sizes in the range of from about 15 micrometers to about 25 micrometers;

(5) lumiphors which contain phosphor particles having a mean particle size of about 5 micrometers;

(6) lumiphors which contain phosphor particles having a mean particle size of about 10 micrometers;

(7) lumiphors which contain phosphor particles having a mean particle size of about 15 micrometers; and (8) lumiphors which contain phosphor particles having a mean particle size of about 20 micrometers, each provide good trade-off between ease of manufacture and minimization of reflected light, and provide lighting devices which are particularly useful in different situations.

In some embodiments of the present invention, therefore, at least one of the lumiphors comprises phosphor particles, and at least some of such phosphor particles (in some cases at least 50 weight percent, in some cases at least 75 weight percent, and in some cases at least 90 weight percent) have particle sizes in the range of from about 3 micrometers to about 7 micrometers.

In some embodiments of the present invention, at least one of the lumiphors comprises phosphor particles, and at least some of such phosphor particles (in some cases at least 50 weight percent, in some cases at least 75 weight percent, and in some cases at least 90 weight percent) have particle sizes in the range of from about 5 micrometers to about 15 micrometers.

In some embodiments of the present invention, at least one of the lumiphors comprises phosphor particles, and at least some of such phosphor particles (in some cases at least 50 weight percent, in some cases at least 75 weight percent, and in some cases at least 90 weight percent) have particle sizes in the range of from about 10 micrometers to about 20 micrometers.

In some embodiments of the present invention, at least one of the lumiphors comprises phosphor particles, and at least some of such phosphor particles (in some cases at least 50 weight percent, in some cases at least 75 weight percent, and in some cases at least 90 weight percent) have particle sizes in the range of from about 15 micrometers to about 25 micrometers.

In some embodiments of the present invention, at least one of the lumiphors comprises phosphor particles, and such phosphor particles have a mean particle size of about 5 micrometers.

In some embodiments of the present invention, at least one of the lumiphors comprises phosphor particles, and such phosphor particles have a mean particle size of about 10 micrometers.

In some embodiments of the present invention, at least one of the lumiphors comprises phosphor particles, and such phosphor particles have a mean particle size of about 15 micrometers.

In some embodiments of the present invention, at least one of the lumiphors comprises phosphor particles, and such phosphor particles have a mean particle size of about 20 micrometers.

In some embodiments of the present invention, the lighting device emits output light of an efficacy of at least 60 lumens per watt (in some embodiments at least 70 lumens per watt, and in some embodiments at least 80 lumens per watt) of electricity supplied to the lighting device.

Efficacy (in lumens per watt), as referred to herein, means brightness as measured relative to outlet energy, i.e., it is a measure of wall plug efficiency (as opposed to values sometimes given on individual components and/or assemblies of components). That is, "efficacy", as used herein, means lumens obtained from power input to the lighting device (not, e.g., lumens obtained from power input to an LED), i.e., efficacy is determined based on the total power consumed in running the lighting device, as opposed to merely the power consumed within one or more components such as individual LEDs.

The present invention is also directed to any of the embodiments described in U.S. Patent Application Ser. No. 60/793,524, filed Apr. 20, 2006, any of the embodiments described in U.S. Patent Application Ser. No. 60/752,555, filed Dec. 21, 2005, any of the embodiments described in U.S. Patent Application Ser. No. 60/793,518, filed Apr. 20, 2006, any of the embodiments described in U.S. Patent Application No. 60/857,305, filed on Nov. 7, 2006, any of the embodiments described in U.S. Pat. No. 7,213,940, issued on May 8, 2007, any of the embodiments described in U.S. Patent Application No. 60/868,134, filed on Dec. 1, 2006 and any of the embodiments described in U.S. Patent Application No. 60/868,986, filed on Dec. 7, 2006, in which the particle size of at least one of the lumiphors is as described above.

In addition, it has unexpectedly been found that surprisingly high CRI Ra can be obtained by combining light as described above with light emitted by light emitting diodes having a dominant wavelength in the range of from 600 nm to 630 nm.

The light emitting diodes can be saturated or non-saturated. The term "saturated", as used herein, means having a purity of at least 85%, the term "purity" having a well-known meaning to persons skilled in the art, and procedures for calculating purity being well-known to those of skill in the art.

Aspects related to the present invention can be represented on either the 1931 CIE (Commission International de I'Eclairage) Chromaticity Diagram or the 1976 CIE Chromaticity Diagram. FIG. 1 shows the 1931 CIE Chromaticity Diagram. FIG. 2 shows the 1976 Chromaticity Diagram. FIG. 3 shows an enlarged portion of the 1976 Chromaticity Diagram, in order to show the blackbody locus in more detail. Persons of skill in the art are familiar with these diagrams, and these diagrams are readily available (e.g., by searching "CIE Chromaticity Diagram" on the internet).

The CIE Chromaticity Diagrams map out the human color perception in terms of two CIE parameters x and y (in the case of the 1931 diagram) or u' and v' (in the case of the 1976 diagram). For a technical description of CIE chromaticity diagrams, see, for example, "Encyclopedia of Physical Science and Technology", vol. 7, 230-231 (Robert A Meyers ed., 1987). The spectral colors are distributed around the edge of the outlined space, which includes all of the hues perceived by the human eye. The boundary line represents maximum saturation for the spectral colors. As noted above, the 1976 CIE Chromaticity Diagram is similar to the 1931 Diagram, except that the 1976 Diagram has been modified such that similar distances on the Diagram represent similar perceived differences in color.

In the 1931 Diagram, deviation from a point on the Diagram can be expressed either in terms of the coordinates or, alternatively, in order to give an indication as to the extent of the perceived difference in color, in terms of MacAdam ellipses. For example, a locus of points defined as being ten MacAdam ellipses from a specified hue defined by a particular set of coordinates on the 1931 Diagram consists of hues which would each be perceived as differing from the specified hue to a common extent (and likewise for loci of points defined as being spaced from a particular hue by other quantities of MacAdam ellipses).

Since similar distances on the 1976 Diagram represent similar perceived differences in color, deviation from a point on the 1976 Diagram can be expressed in terms of the coordinates, u' and v', e.g., distance from the point=$(\Delta u'^2+\Delta v'^2)^{1/2}$, and the hues defined by a locus of points which are each a common distance from a specified hue consist of hues which would each be perceived as differing from the specified hue to a common extent.

The chromaticity coordinates and the CIE chromaticity diagrams illustrated in FIGS. 1-3 are explained in detail in a number of books and other publications, such as pages 98-107 of K. H. Butler, "Fluorescent Lamp Phosphors" (The Pennsylvania State University Press 1980) and pages 109-110 of G. Blasse et al., "Luminescent Materials" (Springer-Verlag 1994), both incorporated herein by reference.

The chromaticity coordinates (i.e., color points) that lie along the blackbody locus obey Planck's equation: $E(\lambda)=\lambda^{-5}/(e^{(B/T)}-1)$, where E is the emission intensity, $\lambda$ is the emission wavelength, T the color temperature of the blackbody and A and B are constants. Color coordinates that lie on or near the blackbody locus yield pleasing white light to a human observer. The 1976 CIE Diagram includes temperature listings along the blackbody locus. These temperature listings show the color path of a blackbody radiator that is caused to increase to such temperatures. As a heated object becomes incandescent, it first glows reddish, then yellowish, then white, and finally blueish. This occurs because the wavelength associated with the peak radiation of the blackbody radiator becomes progressively shorter with increased temperature, consistent with the Wien Displacement Law. Illuminants which produce light which is on or near the blackbody locus can thus be described in terms of their color temperature.

Also depicted on the 1976 CIE Diagram are designations A, B, C, D and E, which refer to light produced by several standard illuminants correspondingly identified as illuminants A, B, C, D and E, respectively.

CRI Ra is a relative measurement of how the color rendition of an illumination system compares to that of a blackbody radiator. The CRI Ra equals 100 if the color coordinates of a set of test colors being illuminated by the illumination system are the same as the coordinates of the same test colors being irradiated by the blackbody radiator.

The present invention may be more fully understood with reference to the accompanying drawings and the following detailed description of the invention.

BRIEF DESCRIPTION OF THE DRAWING FIGURES

FIG. 8 is a cross-sectional view of one of the red LEDs employed in the embodiment depicted in FIGS. 6 and 7.

FIG. 9 is a cross-sectional view of one of the greenish-yellowish emitters employed in the embodiment depicted in FIGS. 6 and 7.

DETAILED DESCRIPTION OF THE INVENTION

Figure 1:
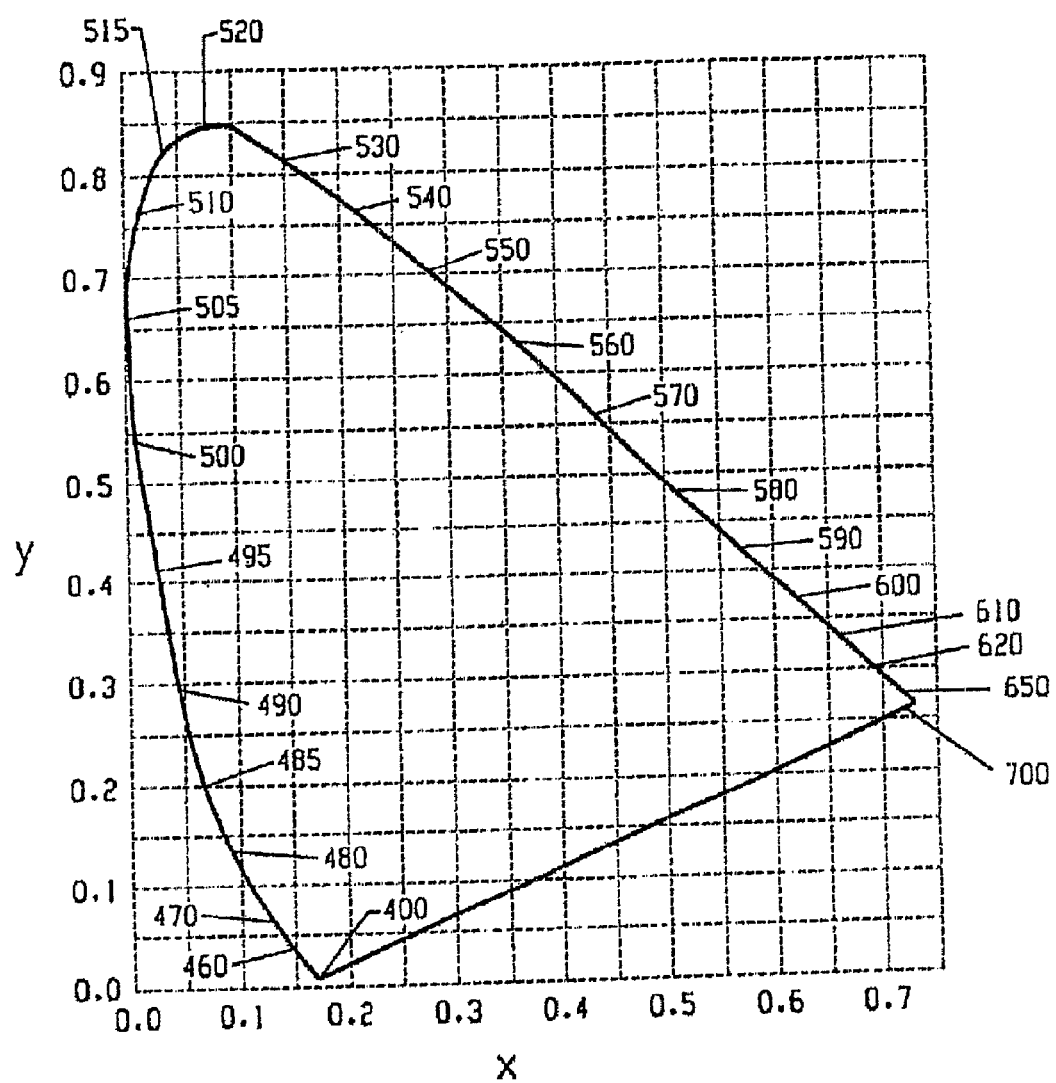
FIG. 1 shows the 1931 CIE Chromaticity Diagram.
Figure 2:
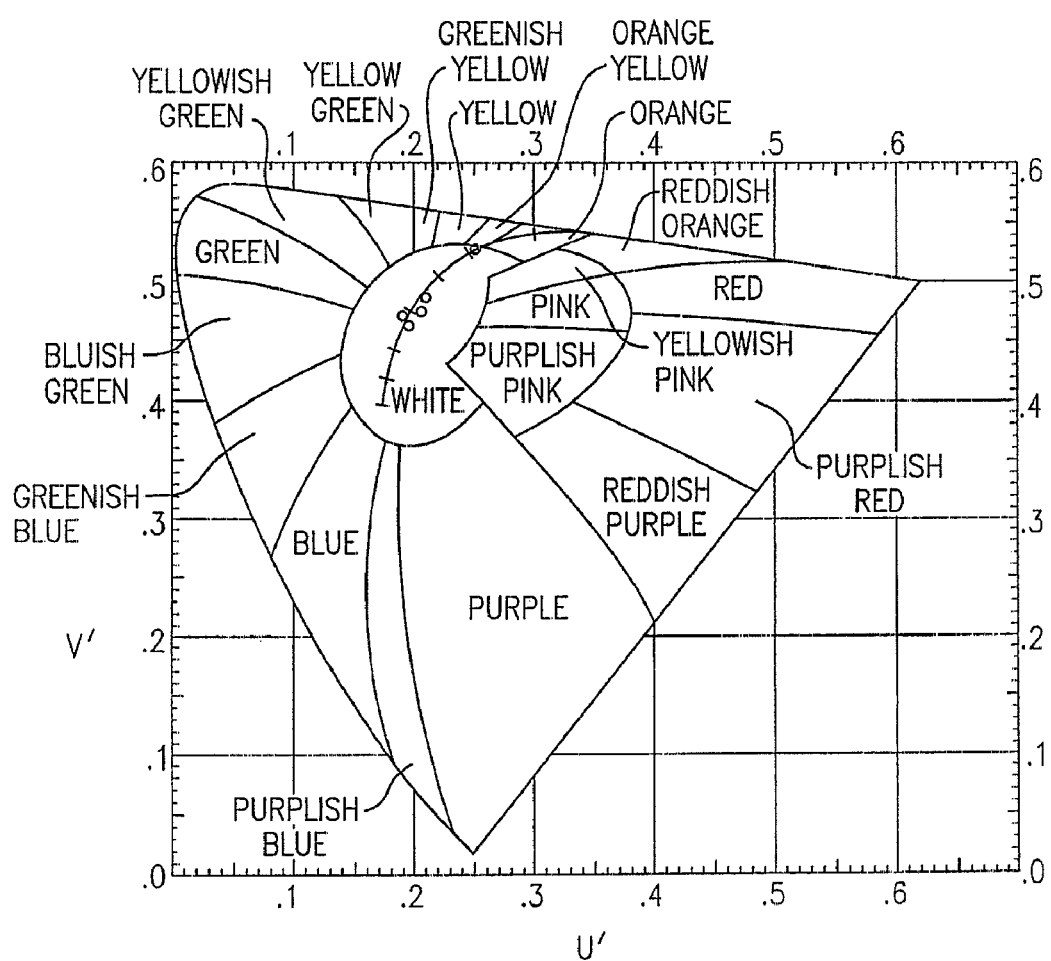
FIG. 2 shows the 1976 Chromaticity Diagram.
Figure 3:
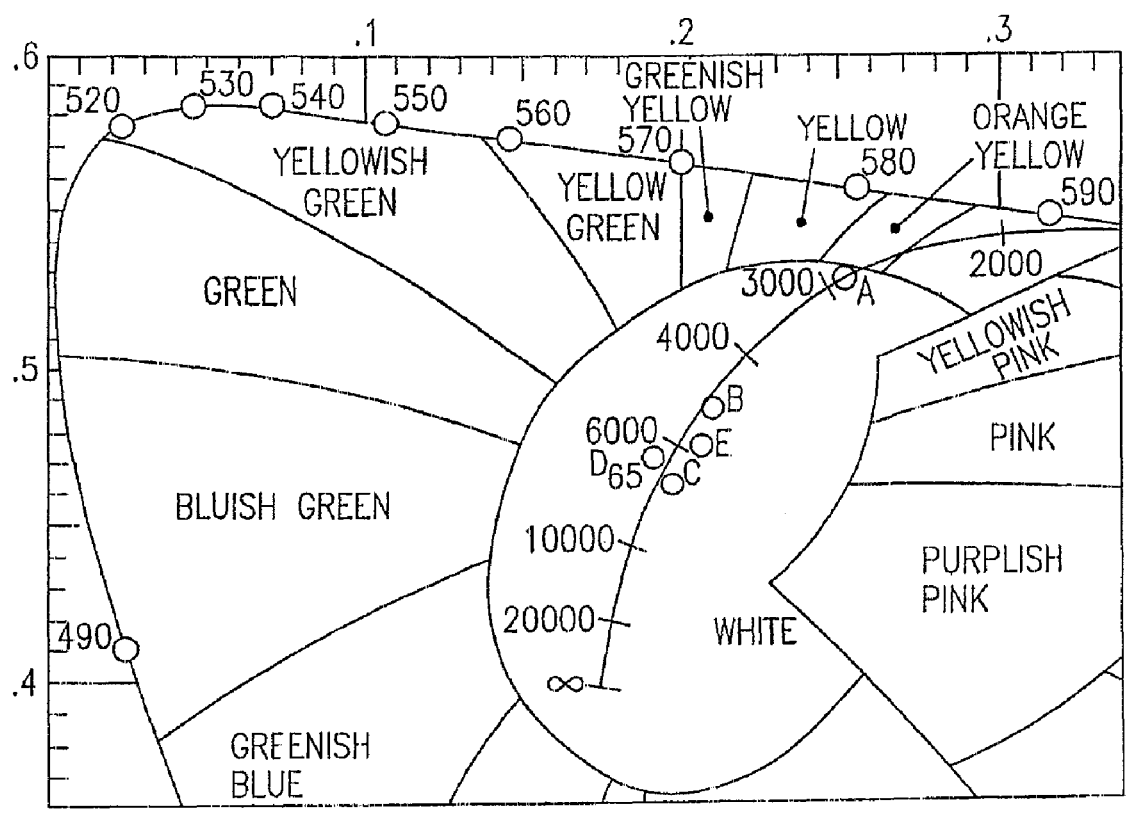
FIG. 3 shows an enlarged portion of the 1976 Chromaticity Diagram, in order to show the blackbody locus in detail.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

When an element such as a layer, region or substrate is referred to herein as being "on" or extending "onto" another element, it can be directly on or extend directly onto the other element or intervening elements may also be present. In contrast, when an element is referred to herein as being "directly on" or extending "directly onto" another element, there are no intervening elements present. Also, when an element is referred to herein as being "connected" or "coupled" to another element, it can be directly connected or coupled to the other element or intervening elements may be present. In contrast, when an element is referred to herein as being "directly connected" or "directly coupled" to another element, there are no intervening elements present.

The expression "correlated color temperature" is used according to its well-known meaning to refer to the temperature of a blackbody that is, in a well-defined sense (i.e., can be readily and precisely determined by those skilled in the art), nearest in color.

The expression "directly or switchably electrically connected" means "directly electrically connected" or "switchably electrically connected."

A statement herein that two components in a device are "directly electrically connected," means that there are no components electrically between the components, the insertion of which materially affect the function or functions provided by the device. For example, two components can be referred to as being electrically connected, even though they may have a small resistor between them which does not materially affect the function or functions provided by the device (indeed, a wire connecting two components can be thought of as a small resistor); likewise, two components can be referred to as being electrically connected, even though they may have an additional electrical component between them which allows the device to perform an additional function, while not materially affecting the function or functions provided by a device which is identical except for not including the additional component; similarly, two components which are directly connected to each other, or which are directly connected to opposite ends of a wire or a trace on a circuit board, are electrically connected.

A statement herein that two components in a device are "switchably electrically connected" means that there is a switch located between the two components, the switch being selectively closed or opened, wherein if the switch is closed, the two components are directly electrically connected, and if the switch is open (i.e., during any time period that the switch is open), the two components are not electrically connected.

The expression "illumination" (or "illuminated"), as used herein when referring to a solid state light emitter, means that at least some current is being supplied to the solid state light emitter to cause the solid state light emitter to emit at least some light. The expression "illuminated" encompasses situations where the solid state light emitter emits light continuously or intermittently at a rate such that a human eye would perceive it as emitting light continuously, or where a plurality of solid state light emitters of the same color or different colors are emitting light intermittently and/or alternatingly (with or without overlap in "on" times) in such a way that a human eye would perceive them as emitting light continuously (and, in cases where different colors are emitted, as a mixture of those colors).

The expression "excited", as used herein when referring to a lumiphor, means that at least some electromagnetic radiation (e.g., visible light, UV light or infrared light) is contacting the lumiphor, causing the lumiphor to emit at least some light. The expression "excited" encompasses situations where the lumiphor emits light continuously or intermittently at a rate such that a human eye would perceive it as emitting light continuously, or where a plurality of lumiphors of the same color or different colors are emitting light intermittently and/or alternatingly (with or without overlap in "on" times) in such a way that a human eye would perceive them as emitting light continuously (and, in cases where different colors are emitted, as a mixture of those colors).

The expression "lighting device" as used herein is not limited, except that it is capable of emitting light. That is, a lighting device can be a device which illuminates an area or volume (e.g., a room, a swimming pool, a warehouse, an indicator, a road, a vehicle, a road sign, a billboard, a ship, a boat, an aircraft, a stadium, a tree, a window, a yard, etc.), an indicator light, or a device or array of devices that illuminate an enclosure, or a device that is used for edge or back-lighting (e.g., back light poster, signage, LCD displays), or any other light emitting device.

Although the terms "first", "second", etc. may be used herein to describe various elements, components, regions, layers, sections and/or parameters, these elements, components, regions, layers, sections and/or parameters should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. Such relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments in accordance with the present invention are described herein with reference to cross-sectional (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a molded region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

The solid state light emitter (or solid state light emitters) used in the devices according to the present invention, and the lumiphor (or lumiphors) used in the devices according to the present invention, can be selected from among any solid state light emitters and lumiphors known to persons of skill in the art. A variety of solid state light emitters are well-known. For example, one type of solid state light emitter is a light emitting diode.

Wide varieties of light emitting diodes and lumiphors are readily obtainable and well known to those of skilled in the art, and any of them can be employed (e.g., AlInGaP for the 600 nm to 630 nm light emitting diodes).

Examples of types of such light emitting diodes include inorganic and organic light emitting diodes, a variety of each of which are well-known in the art.

Representative examples of suitable LEDs for use in the present invention are described in:

(1) U.S. Patent Application No. 60/753,138, filed on Dec. 22, 2005, entitled "Lighting Device" (inventor: Gerald H. Negley;), the entirety of which is hereby incorporated by reference, and U.S. patent application Ser. No. 11/614,180, filed Dec. 21, 2006 (now U.S. Patent Publication No. 2007/0236911);

(2) U.S. Patent Application No. 60/794,379, filed on Apr. 24, 2006, entitled "Shifting Spectral Content in LEDs by Spatially Separating Lumiphor Films" (inventors: Gerald H. Negley and Antony Paul van de Ven;), the entirety of which is hereby incorporated by reference, and U.S. patent application Ser. No. 11/624,811, filed Jan. 19, 2007 (now U.S. Patent Publication No. 2007/0170447;

(3) U.S. Patent Application No. 60/808,702, filed on May 26, 2006, entitled "Lighting Device" (inventors: Gerald H. Negley and Antony Paul van de Ven;), the entirety of which is hereby incorporated by reference, and U.S. patent application Ser. No. 11/751,982, filed May 22, 2007 (now U.S. Patent Publication No. 2007/0274080);

(4) U.S. Patent Application No. 60/808,925, filed on May 26, 2006, entitled "Solid State Light Emitting Device and Method of Making Same" (inventors: Gerald H. Negley and Neal Hunter;), the entirety of which is hereby incorporated by reference, and U.S. patent application Ser. No. 11/753,103, filed May 24, 2007 (now U.S. Patent Publication No. 2007/0280624);

(5) U.S. Patent Application No. 60/802,697, filed on May 23, 2006, entitled "Lighting Device and Method of Making" (inventor: Gerald H. Negley;), the entirety of which is hereby incorporated by reference, and U.S. patent application Ser. No. 11/751,990, filed May 22, 2007 (now U.S. Patent Publication No. 2007/0274063);

(6) U.S. Patent Application No. 60/839,453, filed on Aug. 23, 2006, entitled "LIGHTING DEVICE AND LIGHTING METHOD" (inventors: Antony Paul van de Ven and Gerald H. Negley;), the entirety of which is hereby incorporated by reference;

(7) U.S. Patent Application No. 60/857,305, filed on Nov. 7, 2006, entitled "LIGHTING DEVICE AND LIGHTING METHOD" (inventors: Antony Paul van de Ven and Gerald H. Negley; the entirety of which is hereby incorporated by reference; and (8) U.S. Patent Application No. 60/851,230, filed on Oct. 12, 2006, entitled "LIGHTING DEVICE AND METHOD OF MAKING SAME" (inventor: Gerald H. Negley; the entirety of which is hereby incorporated by reference.

The one or more luminescent materials can be any desired luminescent material. The one or more luminescent materials can be down-converting or up-converting, or can include a combination of both types. For example, the one or more luminescent materials can be selected from among phosphors, scintillators, day glow tapes, inks which glow in the visible spectrum upon illumination with ultraviolet light, etc.

The one or more luminescent materials can be provided in any desired form. For example, the luminescent element can be embedded in a resin (i.e., a polymeric matrix), such as a silicone material, an epoxy material, a glass material or a metal oxide material.

The one or more lumiphors can individually be any lumiphor, a wide variety of which, as noted above, are known to those skilled in the art. For example, the (or each of the) one or more lumiphors can comprise (or can consist essentially of, or can consist of) one or more phosphor. The (or each of the) one or more lumiphors can, if desired, further comprise (or consist essentially of, or consist of) one or more highly transmissive (e.g., transparent or substantially transparent, or somewhat diffuse) binder, e.g., made of epoxy, silicone, glass, metal oxide or any other suitable material (for example, in any given lumiphor comprising one or more binder, one or more phosphor can be dispersed within the one or more binder). For example, the thicker the lumiphor, in general, the lower the weight percentage of the phosphor can be. Representative examples of the weight percentage of phosphor include from about 3.3 weight percent to about 4.7 weight percent, although, as indicated above, depending on the overall thickness of the lumiphor, the weight percentage of the phosphor could be generally any value, e.g., from 0.1 weight percent to 100 weight percent (e.g., a lumiphor formed by subjecting pure phosphor to a hot isostatic pressing procedure). In some situations, a weight percentage of about 20 weight percent is advantageous.

The present invention is further directed to lighting devices as described herein, wherein mixed light exiting the lighting device is in the proximity of light on the blackbody locus having color temperature of 2700 K, 3000 K or 3500 K, namely:

mixed light having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4578, 0.4101, the second point having x, y coordinates of 0.4813, 0.4319, the third point having x, y coordinates of 0.4562, 0.4260, the fourth point having x, y coordinates of 0.4373, 0.3893, and the fifth point having x, y coordinates of 0.4593, 0.3944 (i.e., proximate to 2700 K); or mixed light having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4338, 0.4030, the second point having x, y coordinates of 0.4562, 0.4260, the third point having x, y coordinates of 0.4299, 0.4165, the fourth point having x, y coordinates of 0.4147, 0.3814, and the fifth point having x, y coordinates of 0.4373, 0.3893 (i.e., proximate to 3000 K); or mixed light having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4073, 0.3930, the second point having x, y coordinates of 0.4299, 0.4165, the third point having x, y coordinates of 0.3996, 0.4015, the fourth point having x, y coordinates of 0.3889, 0.3690, and the fifth point having x, y coordinates of 0.4147, 0.3814 (i.e., proximate to 3500 K).

The present invention encompasses devices in which the phosphor particles are as described herein, and in which if the lighting device is supplied with electricity of a first wattage, a mixture of all light exiting from the lighting device which was emitted by the at least one solid state light emitter which emit light having a dominant wavelength which is outside the range of between 600 nm and 700 nm would have x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

The present invention further relates to an illuminated enclosure, comprising an enclosed space and at least one lighting device according to the present invention, wherein the lighting device illuminates at least a portion of the enclosure.

The present invention further relates to an illuminated surface, comprising a surface and at least one lighting device according to the present invention, wherein the lighting device illuminates at least a portion of the surface.

The present invention is further directed to an illuminated area, comprising at least one item selected from among the group consisting of a swimming pool, a room, a warehouse, an indicator, a road, a vehicle, a road sign, a billboard, a ship, a toy, a mirror, a vessel, an electronic device, a boat, an aircraft, a stadium, a computer, a remote audio device, a remote video device, a cell phone, a tree, a window, a yard, a lamppost, an indicator light, or a device or array of devices that illuminate an enclosure, or a device that is used for edge or back-lighting (e.g., back light poster, signage, LCD displays), having mounted therein or thereon at least one lighting device as described herein.

Figure 4:
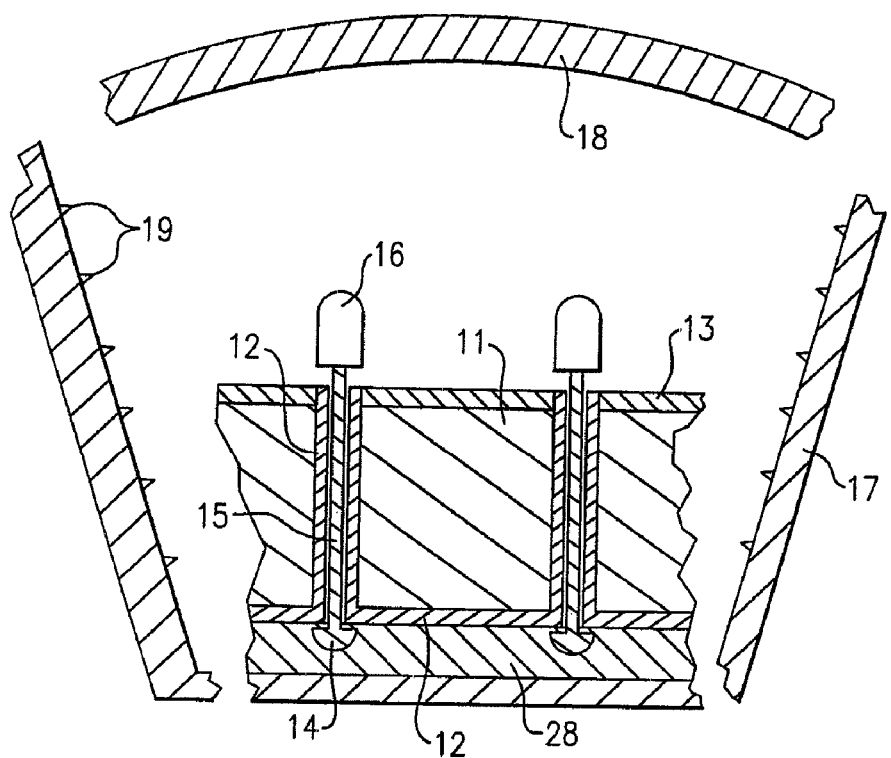
FIG. 4 is a schematic diagram of a representative example of a lighting device in accordance with the present invention.

In addition, persons of skill in the art are familiar with a wide variety of mounting structures for many different types of lighting, and any such structures can be used according to the present invention. For example, FIG. 4 depicts a lighting device which includes a heat spreading element 11 (formed of a material with good heat conducting properties, e.g., aluminum), insulating regions 12 (which can be applied and/or formed in situ, e.g., by anodizing), a highly reflective surface 13 (which can be applied, e.g., MCPET, marketed by Furukawa of Japan, laminated aluminum or silver) or formed in situ, e.g., by polishing), conductive traces 14, leadframes 15, packaged LEDs 16, a reflective cone 17 and a diffusing element 18. The device depicted in FIG. 4 can further include an insulating element 28 below the conductive traces 14 to avoid unintended contact (e.g., a person receiving a shock) with the conductive traces. The device depicted in FIG. 4 can include any number of packaged LEDs (e.g., up to 50 or 100 or more), and so the heat spreading element 11, as well as the insulating regions 12, reflective surface 13 and insulating element 28 can extend any necessary distance to the right or left, in the orientation shown in FIG. 4, as indicated by the fragmented structures (similarly, the sides of the reflective cone 17 can be located any distance to the right or left). Similarly, the diffusing element 18 can be located any desired distance from the LEDs 16. The diffusing element 18 can be attached to the reflective cone 17, the insulating element 28, the heat spreading element 11, or any other desired structure in any suitable way, persons of skill in the art being familiar with and readily able to provide such attachment in a wide variety of ways. In this embodiment, and other embodiments, the heat spreading element 11 serves to spread out the heat, act as a heat sink, and/or dissipate the heat. Likewise, the reflective cone 17 functions as a heat sink. In addition, the reflective cone 17 can include ridges 19 to enhance its reflective properties.

Figure 5:
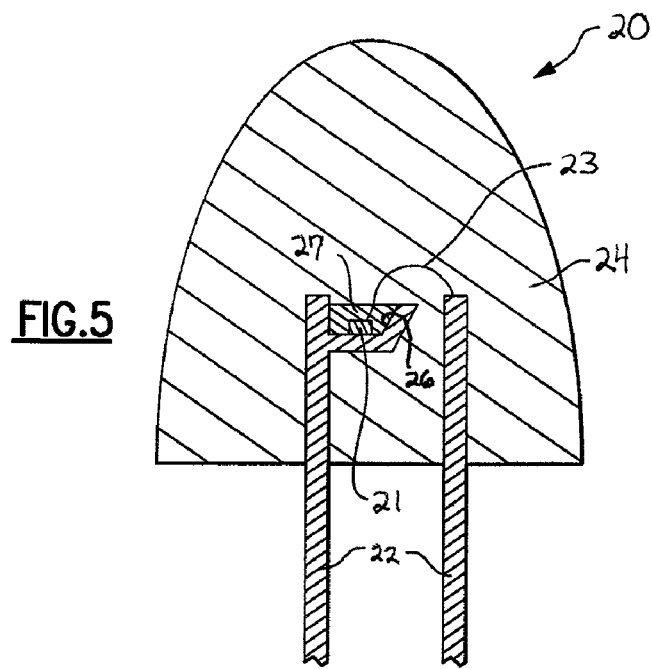
FIG. 5 depicts a representative example of a packaged LED which can be used in the devices according to the present invention.

FIG. 5 depicts a representative example of a packaged LED which can be used in the devices according to the present invention. Referring to FIG. 5, there is shown a lighting device 20 comprising a solid state light emitter 21 (in this case, a light emitting diode chip 21), a lead frame 22, a wire 23, an encapsulant region 24, a reflective element 26 in which the light emitting diode chip 21 is mounted and a lumiphor 27. A packaged LED which does not include any lumiphor (e.g., a 600 nm to 630 nm light emitting diode) can be constructed in a similar way but without the inclusion of a lumiphor 27. Persons of skill in the art are familiar with, and have ready access to, a wide variety of other packaged and unpackaged LED structures, any of which can, if desired, be employed according to the present invention.

In some embodiments according to the present invention, one or more of the light emitting diodes can be included in a package together with one or more of the lumiphors, and the one or more lumiphor in the package can be spaced from the one or more light emitting diode in the package to achieve improved light extraction efficiency, as described in U.S. Patent Application No. 60/753,138, filed on Dec. 22, 2005, entitled "Lighting Device" (inventor: Gerald H. Negley), the entirety of which is hereby incorporated by reference.

In some embodiments according to the present invention, two or more lumiphors can be provided, two or more of the lumiphors being spaced from each other, as described in U.S. Patent Application No. 60/761,310, filed on Jan. 23, 2006, entitled "Shifting Spectral Content in LEDs by Spatially Separating Lumiphor Films" (inventors: Gerald H. Negley and Antony van de Ven), the entirety of which is hereby incorporated by reference.

In some lighting devices according to the present invention, there are further included one or more power sources, e.g., one or more batteries and/or solar cells, and/or one or more standard AC power plugs.

The lighting devices according to the present invention can comprise any desired number of solid state light emitters and lumiphors. For example, a lighting device according to the present invention can include 50 or more light emitting diodes, or can include 100 or more light emitting diodes, etc. In general, with current light emitting diodes, greater efficiency can be achieved by using a greater number of smaller light emitting diodes (e.g., 100 light emitting diodes each having a surface area of 0.1 mm$^2$ vs. 25 light emitting diodes each having a surface area of 0.4 mm$^2$ but otherwise being identical).

Analogously, light emitting diodes which operate at lower current densities are generally more efficient. Light emitting diodes which draw any particular current can be used according to the present invention. In one aspect of the present invention, light emitting diodes which each draw not more than 50 milliamps are employed.

The sources of visible light in the lighting devices of the present invention can be arranged, mounted and supplied with electricity in any desired manner, and can be mounted on any desired housing or fixture. Skilled artisans are familiar with a wide variety of arrangements, mounting schemes, power supplying apparatuses, housings and fixtures, and any such arrangements, schemes, apparatuses, housings and fixtures can be employed in connection with the present invention. The lighting devices of the present invention can be electrically connected (or selectively connected) to any desired power source, persons of skill in the art being familiar with a variety of such power sources.

Representative examples of arrangements of sources of visible light, mounting structures, schemes for mounting sources of visible light, apparatus for supplying electricity to sources of visible light, housings for sources of visible light, fixtures for sources of visible light, power supplies for sources of visible light and complete lighting assemblies, all of which are suitable for the lighting devices of the present invention, are described in:

(1) U.S. Patent Application No. 60/752,753, filed on Dec. 21, 2005, entitled "Lighting Device" (inventors: Gerald H. Negley, Antony Paul van de Ven and Neal Hunter;), the entirety of which is hereby incorporated by reference, and U.S. patent application Ser. No. 11/613,692, filed Dec. 20, 2006 (now U.S. Patent Publication No. 2007/0139923);

(2) U.S. Patent Application No. 60/798,446, filed on May 5, 2006, entitled "Lighting Device" (inventor: Antony Paul van de Ven;), the entirety of which is hereby incorporated by reference, and U.S. patent application Ser. No. 11/743,754, filed May 3, 2007 now U.S. Patent Publication No. 2007/0263393);

(3) U.S. Patent Application No. 60/845,429, filed on Sep. 18, 2006, entitled "LIGHTING DEVICES, LIGHTING ASSEMBLIES, FIXTURES AND METHODS OF USING SAME" (inventor: Antony Paul van de Ven;), the entirety of which is hereby incorporated by reference;

(4) U.S. Patent Application No. 60/846,222, filed on Sep. 21, 2006, entitled "LIGHTING ASSEMBLIES, METHODS OF INSTALLING SAME, AND METHODS OF REPLACING LIGHTS" (inventors: Antony Paul van de Ven and Gerald H. Negley;), the entirety of which is hereby incorporated by reference;

(5) U.S. Patent Application No. 60/809,618, filed on May 31, 2006, entitled "LIGHTING DEVICE AND METHOD OF LIGHTING" (inventors: Gerald H. Negley,), Antony Paul van de Ven and Thomas G. Coleman; the entirety of which is hereby incorporated by reference; and (6) U.S. Patent Application No. 60/858,558, filed on Nov. 13, 2006, entitled "LIGHTING DEVICE, ILLUMINATED ENCLOSURE AND LIGHTING METHODS" (inventor: Gerald H. Negley;), the entirety of which is hereby incorporated by reference.

The light emitting diodes and lumiphors can be arranged in any desired pattern. In some embodiments according to the present invention which include 600 nm to 630 nm light emitting diodes as well as 430 nm to 480 nm light emitting diodes, some or all of the 600 nm light emitting diodes are surrounded by five or six 430 nm to 480 nm light emitting diodes (some or all of which may or may not include 555 nm to 585 nm lumiphors), e.g., the 600 nm to 630 nm light emitting diodes and the 430 nm to 480 nm light emitting diodes are arranged in generally laterally arranged rows and spaced from one another substantially evenly, each row being laterally offset from the next adjacent (in a longitudinal direction) row by half the distance between laterally adjacent light emitting diodes, with, in most locations, two 430 nm to 480 nm light emitting diodes being located between each 600 nm to 630 nm light emitting diode and its nearest neighbor in the same row, and with the 600 nm to 630 nm light emitting diodes in each row being offset from the nearest 600 nm to 630 light emitting diode(s) in the next adjacent (in a longitudinal direction) row by one and a half times the distance between laterally spaced adjacent light emitting diodes. Alternatively or additionally, in some embodiments according to the present invention, some or all of the brighter light emitting diodes are placed closer to a center of the lighting device than the dimmer light emitting diodes.

The devices according to the present invention can further comprise one or more long-life cooling device (e.g., a fan with an extremely high lifetime). Such long-life cooling device(s) can comprise piezoelectric or magnetorestrictive materials (e.g., MR, GMR, and/or HMR materials) that move air as a "Chinese fan". In cooling the devices according to the present invention, typically only enough air to break the boundary layer is required to induce temperature drops of 10 to 15 degrees C. Hence, in such cases, strong 'breezes" or a large fluid flow rate (large CFM) are typically not required (thereby avoiding the need for conventional fans).

In some embodiments according to the present invention, any of the features, e.g., circuitry, as described in U.S. Patent Application No. 60/761,879, filed on Jan. 25, 2006, entitled "Lighting Device With Cooling" (inventors: Thomas Coleman, Gerald H. Negley and Antony van de Ven), the entirety of which is hereby incorporated by reference, can be employed.

The devices according to the present invention can further comprise secondary optics to further change the projected nature of the emitted light. Such secondary optics are well-known to those skilled in the art, and so they do not need to be described in detail herein—any such secondary optics can, if desired, be employed.

The devices according to the present invention can further comprise sensors or charging devices or cameras, etc. For example, persons of skill in the art are familiar with, and have ready access to, devices which detect one or more occurrence (e.g., motion detectors, which detect motion of an object or person), and which, in response to such detection, trigger illumination of a light, activation of a security camera, etc. As a representative example, a device according to the present invention can include a lighting device according to the present invention and a motion sensor, and can be constructed such that (1) while the light is illuminated, if the motion sensor detects movement, a security camera is activated to record visual data at or around the location of the detected motion, or (2) if the motion sensor detects movement, the light is illuminated to light the region near the location of the detected motion and the security camera is activated to record visual data at or around the location of the detected motion, etc.

For indoor residential illumination a color temperature of 2700k to 3300k is normally preferred, and for outdoor flood lighting of colorful scenes a color temperature approximating daylight 5000K (4500-6500K) is preferred.

Figure 6:
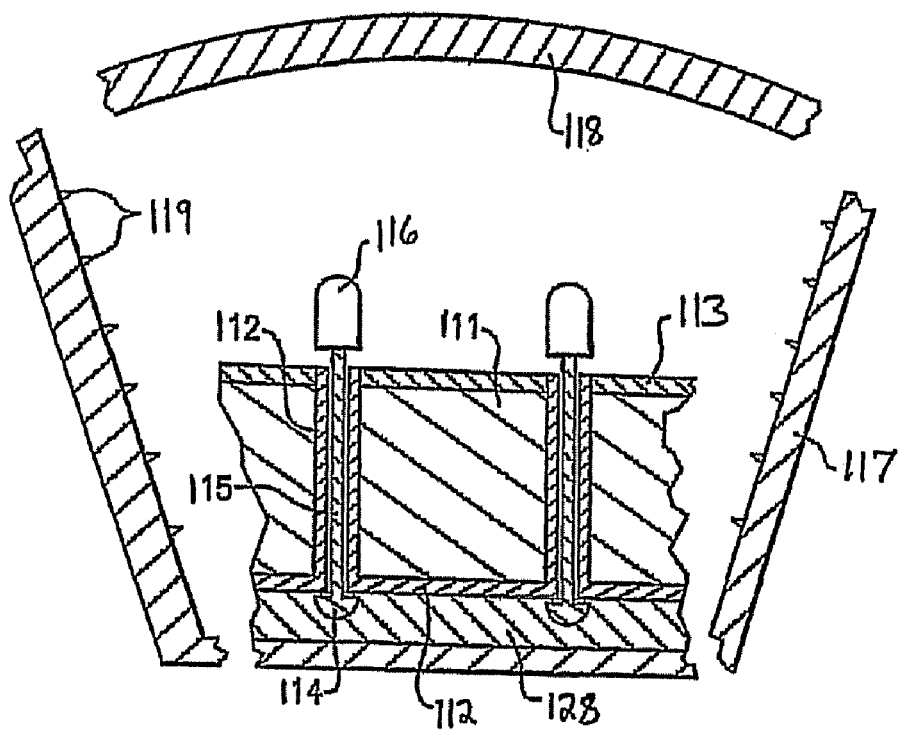
FIG. 6 depicts a first embodiment of a lighting device in accordance with the first aspect of the present invention.

FIG. 6 depicts a first embodiment of a lighting device in accordance with the first aspect of the present invention.

Referring to FIG. 6, there is shown a lighting device which includes a heat spreading element 111 (formed of aluminum), insulating regions 112 (formed in situ by anodizing surfaces of the aluminum heat spreading element), a highly reflective surface 113 (formed in situ by polishing the surface of the aluminum heat spreading element), conductive traces 114 formed of copper, lead frames 115 formed of silver-plated copper (or silver-plated mild steel), packaged LEDs 116*a*, 116*b* (described in more detail below), a reflective cone 117 (made of MCPET® (marketed by Furukawa, a Japanese corporation) with a diffuse light scattering surface and a diffusing element 118 (the diffusing element 118 performs a light scattering function).

The thickness of the heat spreading element 111 is about 10 mm.

The reflective cone 117 is about 1 mm thick.

The diffusing element 118 is about 0.2 mm thick and is made of glass (or plastic).

The device depicted in FIG. 6 further includes an insulating element 128 below the conductive traces 114. The insulating element 128 is about 250 micrometers thick and is made of T-preg™ by T-Lam™ (see www.ewh.ieee.org/soc/cpmt/pre-sentations/cpmt0412.pdf).

The device depicted in FIG. 6 includes three series strings of LED emitters.

Connected to the first string of LED emitters are a current regulator, forty-seven red LEDs 116*a* (shown in more detail in FIG. 8), and twenty-one greenish-yellowish emitters 116*b* (each including a blue LED and a broad spectrum emitting lumiphor) (shown in more detail in FIG. 9).

Connected to the second string of LED emitters are a current regulator, zero red LEDs and fifty-one greenish-yellowish emitters 116*b* (as above).

Connected to the third string of LED emitters are a current regulator, zero red LEDs and fifty-one greenish-yellowish emitters 116*b* (as above).

The voltage drop across each of the red LEDs 116*a* is about 2 volts.

The voltage drop across each of the blue LEDs is about 3 volts.

The voltage drop across each of the current regulators is about 7 volts.

The current passing through the first string of LED emitters is regulated to be about 20 milliamps.

The current passing through the second string of LED emitters is regulated to be about 20 milliamps.

The current passing through the third string of LED emitters is regulated to be about 20 milliamps.

The diffusing element 118 is located about two inches from the heat spreading element 111. The diffusing element 118 is attached to a top region of the reflective cone 117. The insulating element 128 is also attached to a bottom region of the reflective cone 117.

The heat spreading element 111 serves to spread out the heat, act as a heat sink, and dissipate the heat from the LEDs. Likewise, the reflective cone 117 functions as a heat sink. In addition, the reflective cone 117 includes ridges 119 to enhance its reflective properties.

Figure 7:
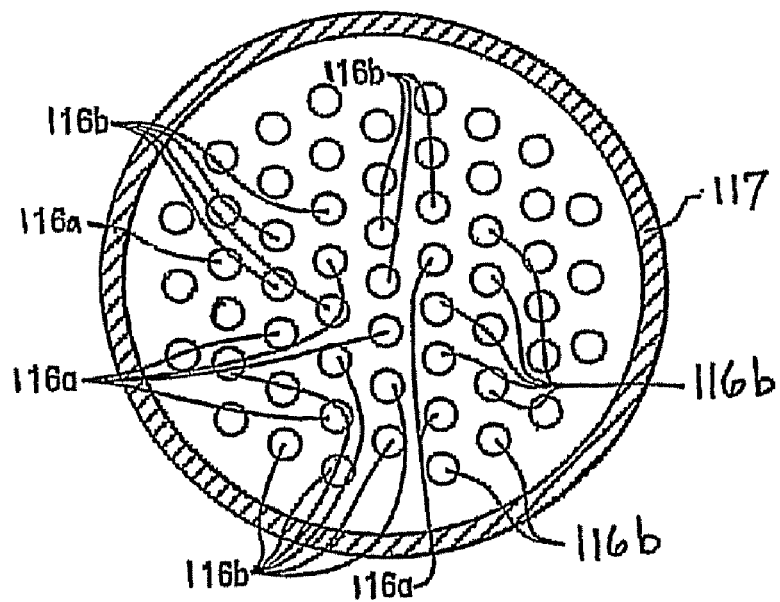
FIG. 7 is a sectional view taken along plane V-V shown in FIG. 6 (and is not drawn to the same scale as FIG. 6).

FIG. 7 is a sectional view taken along plane V-V shown in FIG. 6 (and is not drawn to the same scale as FIG. 6).

As shown in FIG. 7, each of the red LEDs 116*a* is surrounded by five or six greenish-yellowish emitters 116*b*, i.e., the red LEDs 116*a* and the greenish-yellowish emitters 116*b* are arranged in generally laterally arranged rows and spaced from one another substantially evenly, each row being laterally offset from the next adjacent (in a longitudinal direction) row by half the distance between laterally adjacent light emitting diodes, with, in most locations, two greenish-yellowish emitters 116*b* being located between each red LED 116*a* and its nearest red LED 116*a* neighbor in the same row, and with the red LEDs 116*a* in each row being offset from the nearest red LED(s) 116*a* in the next adjacent (in a longitudinal direction) row by one and a half times the distance between laterally spaced adjacent light emitting diodes. The spacing between each adjacent LED in each row is about 6 mm.

FIG. 8 is a cross-sectional view of one of the red LEDs 116*a* employed in the embodiment depicted in FIGS. 6 and 7.

Referring to FIG. 8, each of the red LEDs 116*a* includes a red light emitting diode chip 121 (from Epistar in Taiwan, measuring 14 mils×14 mils, comprising AlInGaP and having a brightness of not less than 600 mcd), a lead frame 115 having a reflective surface 122, a copper wire 123, and an encapsulant region 124. The reflective surface 122 is made of silver. The encapsulant region 124 is made of Hysol OS 4000. The red LEDs 116*a* are nearly saturated, i.e., they have a purity of at least 85%, the term "purity" having a well-known meaning to persons skilled in the art, and procedures for calculating purity being well-known to those of skill in the art. The red LEDs 116*a* emit light having a dominant wavelength in the range of from about 612 nm to about 625 nm.

FIG. 9 is a cross-sectional view of one of the greenish-yellowish emitters 116*b* employed in the embodiment depicted in FIGS. 6 and 7.

Referring to FIG. 9, each of the greenish-yellowish emitters 116*b* includes a blue light emitting diode chip 31 (namely, a Cree XT LED (C460XT290) die with a peak wavelength range of from about 450 nm to about 465 nm, and optical power greater than 24 mW), a lead frame 115 having a reflective surface 32, a copper wire 33, an encapsulant region 34, and a broad spectrum emitting lumiphor 35. The reflective surface 32 is made of silver. The encapsulant region 34 is made of Hysol OS400 or GE/Toshiba Invisil 5332. The lumiphor 35 comprises a luminescent material consisting of QMK58/F-U1 YAG:Ce by Phosphor Teck-UK dispersed in a binder made of Hysol OS400 or GE/Toshiba 5332. The luminescent material is loaded in the binder in an amount in the range of from about 10 to about 12 percent by weight, based on the total weight of the binder and the luminescent material. The luminescent material particles have particle sizes in the range of from about 1.6 micrometers to about 8.6 micrometers, with the mean particle size being in the range of from about 4 micrometers to about 5 micrometers. The lumiphor 35 is spaced from the chip 31 by a distance in the range of from about 100 micrometers to about 750 micrometers (for example, from about 500 micrometers to about 750 micrometers, e.g., about 750 micrometers). The blue chip 31 emits light having a peak wavelength in the range of from about 450 nm to about 465 nm.

The combined light exiting the lumiphor 35 (i.e., a mixture of light including blue light emitted by the blue chip 31 which passes through the lumiphor and light emitted by the luminescent material upon being excited by light emitted from the blue chip 31), corresponds to a point on the 1931 CIE Chromaticity Diagram having x, y color coordinates which define a point which is within an area on a 1931 CTE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38, specific examples including a point having x, y color coordinates of 0.3706, 0.4370 for 2850 K light, and 0.3550, 0.4089 for 3400 K light.

Figure 10:
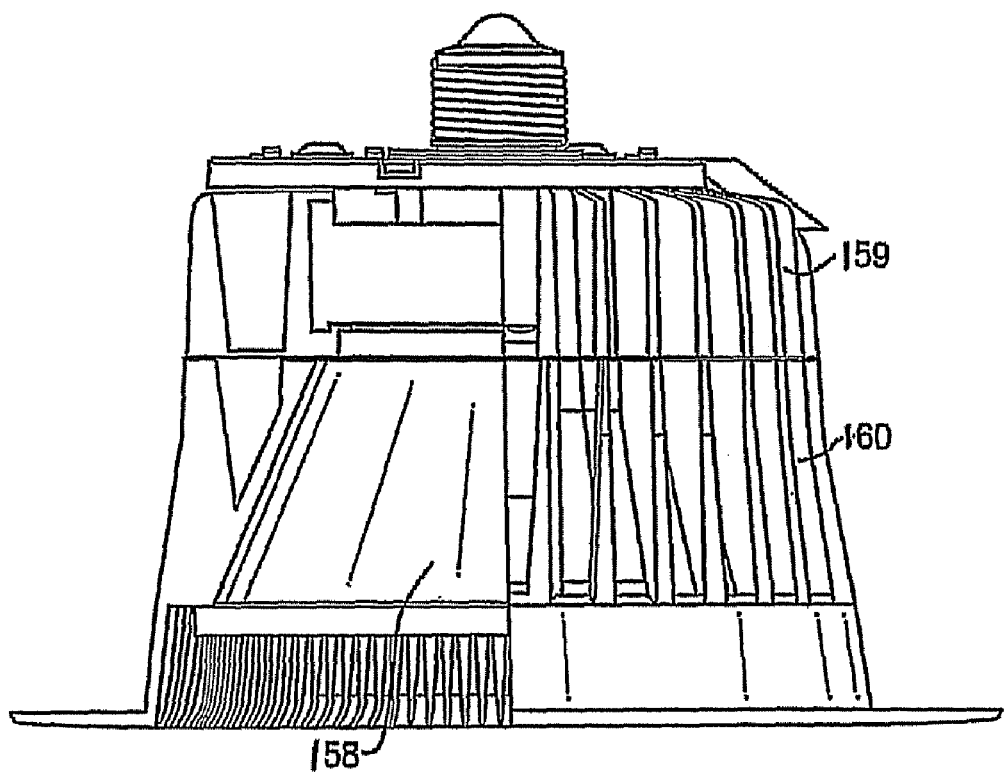
FIG. 10 is a partial cutaway view of a second embodiment of a lighting device in accordance with the present invention.
Figure 11:
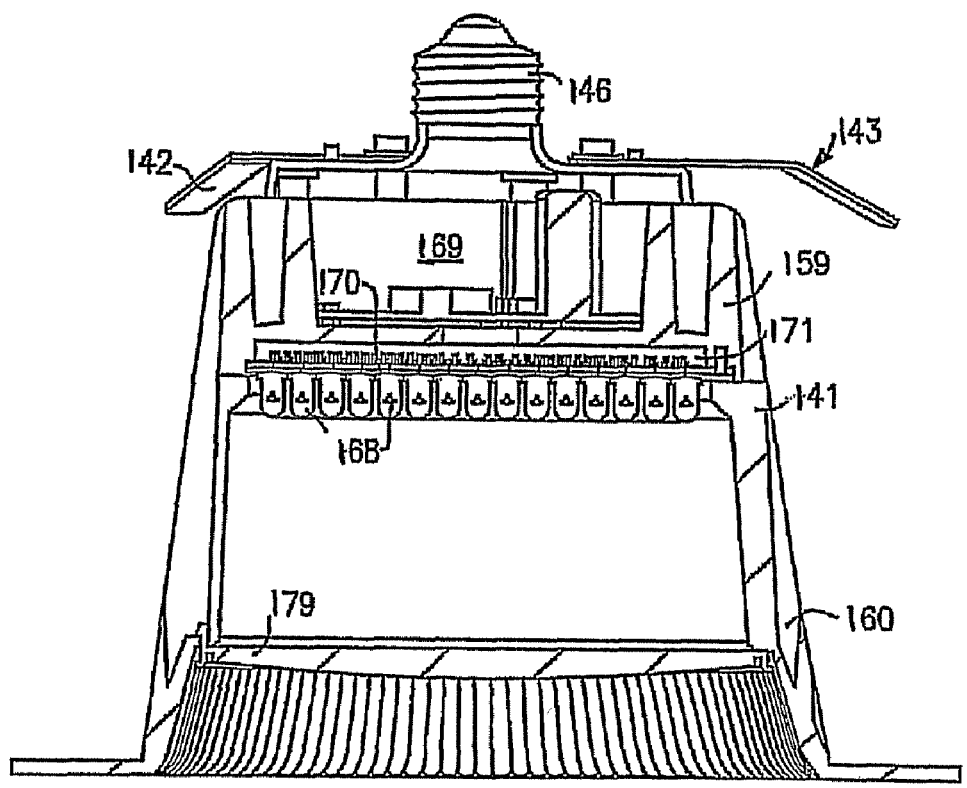
FIG. 11 is a sectional view of a lighting device of the second embodiment, in which the shape differs somewhat from the device depicted in FIG. 10.
Figure 12:
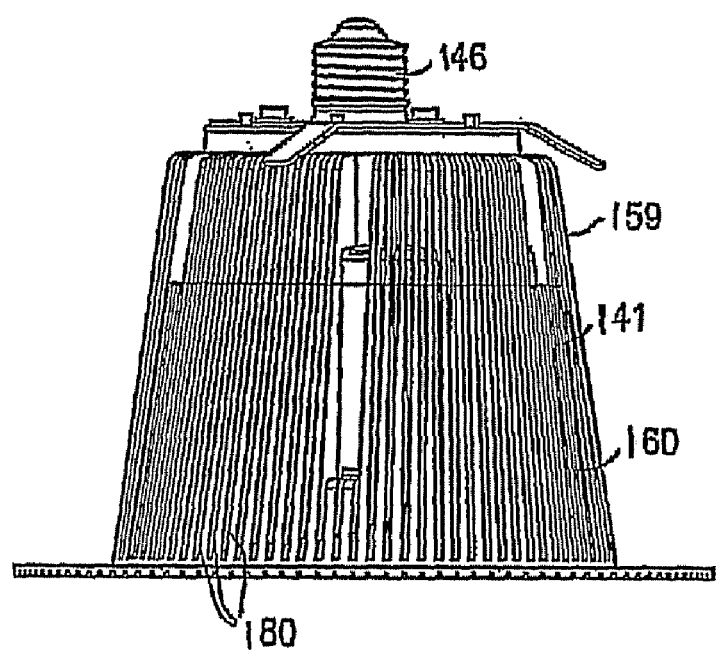
FIG. 12 is a view of the exterior surface of the light engine housing of a lighting device of the second embodiment.

FIGS. 10-13 depict a second embodiment of a lighting device in accordance with the present invention. FIG. 10 is a partial cutaway view of the lighting device of the second embodiment. FIG. 11 is a sectional view of the lighting device, in which the shape differs somewhat from the device depicted in FIG. 10, but the description below applies equally.

Referring to FIG. 11, the lighting device comprises a light engine housing 41. The device further comprises a first mounting clip 42, a second mounting clip 43 and a third mounting clip 44 (the clip 44 is not visible in FIG. 11).

The light engine housing 41 comprises a screw-threaded electrical connection region 46 which can be received in an Edison socket.

The light engine housing 41 comprises an upper housing 59 and a lower housing 60. The interior of the lower housing 60 comprises a reflective cone 58 (see FIG. 10) (facing inward) made of MCPET® (foamed sheets made of polyethylene terephthalate).

The device includes a light engine which comprises a plurality of LEDs 68, a ballast element 69, a circuit board 70 and a heat transfer region 71. The heat transfer region comprises epoxy with dispersed particles of SiC. Each of the LEDs 68 includes a pair of electrically conductive legs which extend through the circuit board 70 (and which are soldered to conductive regions on the circuit board 70) and into the heat transfer region 71.

A first region of the ballast element 69 is electrically connected to the electrical connection region 46, and a second region of the ballast element 69 is electrically connected to the light engine. The ballast element 69 comprises circuitry which, if power of a first voltage is supplied to the first region of the first ballast element, outputs power of a second voltage, and supplies the power of the second voltage to the light engine.

The lighting device also includes a light diffuser 79.

The exterior surface of the light engine housing has a plurality of fins 80 (most easily seen in FIG. 12) to assist in heat dissipation from the light engine housing.

The lighting device includes a plurality (e.g., three) of series strings of LED emitters.

Connected to a first string of LED emitters are a current regulator and a plurality (e.g., six) of greenish-yellowish emitters. Each of the greenish-yellowish emitter includes a blue LED and a lumiphor, the lumiphor comprising YAG doped with Ce, Pr and/or Gd.

Connected to a second string of LED emitters are a current regulator, and a ratio of red LEDs to greenish-yellowish emitters, e.g., zero red LEDs and a plurality (e.g., six) of greenish-yellowish emitters.

Connected to a third string of LED emitters are a current regulator, and a different ratio of red LEDs to greenish-yellowish emitters, e.g., a plurality of red LEDs (e.g., thirty) and zero greenish-yellowish emitters.

The three strings are electrically connected to a common power line, whereby they are simultaneously driven. Using the current regulators on each string, the current supplied to each string can be adjusted.

Each of the LED emitters comprises an LED chip mounted on a reflective cup made of silver-plated copper. Each of the red LEDs emits light of substantially the same dominant wavelength.

Figure 13:
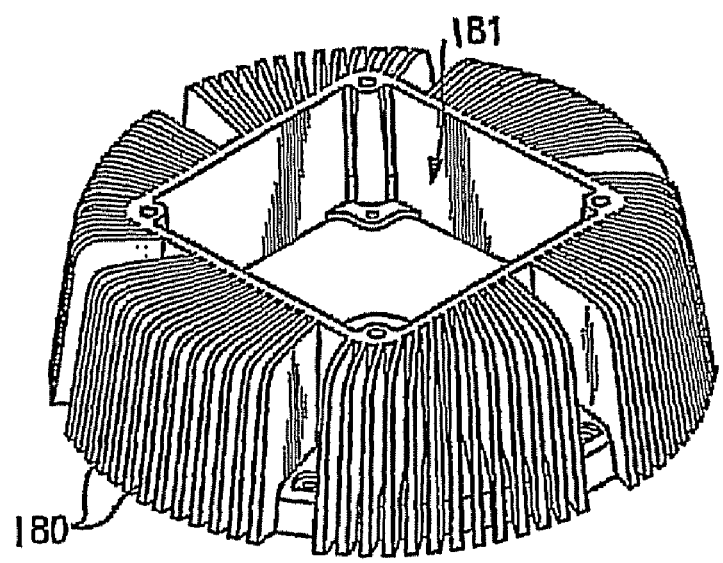
FIG. 13 is a perspective view of the upper housing of a lighting device of the second embodiment, including a recess for receiving a ballast element that is not shown.

At least some of the greenish-yellowish LEDs are each surrounded by red emitters. FIG. 13 is a perspective view of the upper housing, including a recess 81 in which the ballast element (not shown) is positioned.

Any two or more structural parts of the lighting devices described herein can be integrated. Any structural part of the lighting devices described herein can be provided in two or more parts (which can be held together, if necessary).

Furthermore, while certain embodiments of the present invention have been illustrated with reference to specific combinations of elements, various other combinations may also be provided without departing from the teachings of the present invention. Thus, the present invention should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

The invention claimed is:

1. A lighting device comprising:
at least one solid state light emitter; and
at least one lumiphor;
wherein:
if each of said at least one solid state light emitter is illuminated and each of said at least one lumiphor is excited, a mixture of light exiting the lighting device that was emitted from said at least one solid state light emitter and light exiting the lighting device that was emitted from said at least one lumiphor would, in the absence of any additional light, have a mixed illumination having x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38, and said at least one lumiphor comprises phosphor particles, at least some of said phosphor particles having particle sizes in the range of from about 3 micrometers to about 7 micrometers, said lighting device, when supplied with electricity, emitting output light with a wall plug efficiency of at least 60 lumens per watt of said electricity.

2. A lighting device as recited in claim 1, wherein at least 50 weight percent of said phosphor particles have particle sizes in the range of from about 3 micrometers to about 7 micrometers.

3. A lighting device as recited in claim 1, wherein at least 75 weight percent of said phosphor particles have particle sizes in the range of from about 3 micrometers to about 7 micrometers.

4. A lighting device as recited in claim 1, wherein at least 90 weight percent of said phosphor particles have particle sizes in the range of from about 3 micrometers to about 7 micrometers.

5. A lighting device as recited in claim 1, wherein said phosphor particles have a mean particle size of about 5 micrometers.

6. A lighting device as recited in claim 1, wherein said at least one solid state light emitter comprises at least one light emitting diode.

7. A lighting device as recited in claim 6, wherein said at least one light emitting diode, if illuminated, would emit light having a peak wavelength in the range of from 430 nm to 480 nm.

8. A lighting device as recited in claim 1, wherein said at least one lumiphor, if excited, would emit light having a dominant wavelength in the range of from about 555 nm to about 585 nm.

9. A lighting device as recited in claim 1, further comprising at least a second solid state light emitter, wherein said second solid state light emitter is a light emitting diode which, if illuminated, would emit light having a dominant wavelength in the range of from 600 nm to 630 nm.

10. A lighting device comprising:
at least one solid state light emitter; and
at least one lumiphor;
wherein:
if each of said at least one solid state light emitter is illuminated and each of said at least one lumiphor is excited, a mixture of light exiting the lighting device that was emitted from said at least one solid state light emitter and light exiting the lighting device that was emitted from said at least one lumiphor would, in the absence of any additional light, have a mixed illumination having x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38, and said at least one lumiphor comprises phosphor particles, at least some of said phosphor particles having particle sizes in the range of from about 5 micrometers to about 15 micrometers, said lighting device, when supplied with electricity, emitting output light with a wall plug efficiency of at least 60 lumens per watt of said electricity.

11. A lighting device as recited in claim 10, wherein:
the at least one lumiphor comprises phosphor in a weight percentage of from about 3.3 weight percent to about 4.7 weight percent, based on the weight of the lumiphor.

12. A lighting device as recited in claim 10, wherein mixed light exiting the lighting device has x, y color coordinates which define a point which is within an area on a 1931 CIE Chromaticity Diagram selected from among:

a first area enclosed by sixth, seventh, eighth, ninth and tenth line segments, the sixth line segment connecting a sixth point to a seventh point, the seventh line segment connecting the seventh point to a eighth point, the eighth line segment connecting the eighth point to a ninth point, the ninth line segment connecting the ninth point to a tenth point, and the tenth line segment connecting the tenth point to the sixth point, the sixth point having x, y coordinates of 0.4578, 0.4101, the seventh point having x, y coordinates of 0.4813, 0.4319, the eighth point having x, y coordinates of 0.4562, 0.4260, the ninth point having x, y coordinates of 0.4373, 0.3893, and the tenth point having x, y coordinates of 0.4593, 0.3944;

a second area enclosed by eleventh, twelfth, thirteenth, fourteenth and fifteenth line segments, the eleventh line segment connecting a eleventh point to a twelfth point, the twelfth line segment connecting the twelfth point to a thirteenth point, the thirteenth line segment connecting the thirteenth point to a fourteenth point, the fourteenth line segment connecting the fourteenth point to a fifteenth point, and the fifteenth line segment connecting the fifteenth point to the eleventh point, the eleventh point having x, y coordinates of 0.4338, .4030, the twelfth point having x, y coordinates of 0.4562, 0.4260, the thirteenth point having x, y coordinates of 0.4299, 0.4165, the fourteenth point having x, y coordinates of 0.4147, 0.3814, and the fifteenth point having x, y coordinates of 0.4373, 0.3893; and a third area enclosed by sixteenth, seventeenth, eighteenth, nineteenth and twentieth line segments, the sixteenth line segment connecting a sixteenth point to a seventeenth point, the seventeenth line segment connecting the seventeenth point to a eighteenth point, the eighteenth line segment connecting the eighteenth point to a nineteenth point, the nineteenth line segment connecting the nineteenth point to a twentieth point, and the twentieth line segment connecting the twentieth point to the sixteenth point, the sixteenth point having x, y coordinates of 0.4073, 0.3930, the seventeenth point having x, y coordinates of 0.4299, 0.4165, the eighteenth point having x, y coordinates of 0.3996, 0.4015, the nineteenth point having x, y coordinates of 0.3889, 0.3690, and the twentieth point having x, y coordinates of 0.4147, 0.3814.

13. A lighting device as recited in claim 10, wherein at least 50 weight percent of said phosphor particles have particle sizes in the range of from about 5 micrometers to about 15 micrometers.

14. A lighting device as recited in claim 10, wherein at least 75 weight percent of said phosphor particles have particle sizes in the range of from about 5 micrometers to about 15 micrometers.

15. A lighting device as recited in claim 10, wherein at least 90 weight percent of said phosphor particles have particle sizes in the range of from about 5 micrometers to about 15 micrometers.

16. A lighting device as recited in claim 10, wherein said phosphor particles have a mean particle size of about 10 micrometers.

17. A lighting device as recited in claim 10, wherein said at least one solid state light emitter comprises at least one light emitting diode.

18. A lighting device as recited in claim 17, wherein said at least one light emitting diode, if illuminated, would emit light having a peak wavelength in the range of from 430 nm to 480 nm.

19. A lighting device as recited in claim 10, wherein said at least one lumiphor, if excited, would emit light having a dominant wavelength in the range of from about 555 nm to about 585 nm.

20. A lighting device as recited in claim 10, further comprising at least a second solid state light emitter, wherein said second solid state light emitter is a light emitting diode which, if illuminated, would emit light having a dominant wavelength in the range of from 600 nm to 630 nm.

21. A lighting device comprising:
at least one solid state light emitter; and
at least one lumiphor;
wherein:
if each of said at least one solid state light emitter is illuminated and each of said at least one lumiphor is excited, a mixture of light exiting the lighting device that was emitted from said at least one solid state light emitter and light exiting the lighting device that was emitted from said at least one lumiphor would, in the absence of any additional light, have a mixed illumination having x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38, and
said at least one lumiphor comprises phosphor particles, at least some of said phosphor particles having particle sizes in the range of from about 10 micrometers to about 20 micrometers,
said lighting device, when supplied with electricity, emitting output light with a wall plug efficiency of at least 60 lumens per watt of said electricity.

22. A lighting device as recited in claim 21, wherein at least 50 weight percent of said phosphor particles have particle sizes in the range of from about 10 micrometers to about 20 micrometers.

23. A lighting device as recited in claim 21, wherein at least 75 weight percent of said phosphor particles have particle sizes in the range of from about 10 micrometers to about 20 micrometers.

24. A lighting device as recited in claim 21, wherein at least 90 weight percent of said phosphor particles have particle sizes in the range of from about 10 micrometers to about 20 micrometers.

25. A lighting device as recited in claim 21, wherein said phosphor particles have a mean particle size of about 15 micrometers.

26. A lighting device as recited in claim 21, wherein said at least one solid state light emitter comprises at least one light emitting diode.

27. A lighting device as recited in claim 26, wherein said at least one light emitting diode, if illuminated, would emit light having a peak wavelength in the range of from 430 nm to 480 nm.

28. A lighting device as recited in claim 21, wherein said at least one lumiphor, if excited, would emit light having a dominant wavelength in the range of from about 555 nm to about 585 nm.

29. A lighting device as recited in claim 21, further comprising at least a second solid state light emitter, wherein said second solid state light emitter is a light emitting diode which, if illuminated, would emit light having a dominant wavelength in the range of from 600 nm to 630 nm.

30. A lighting device comprising:
at least one solid state light emitter; and
at least one lumiphor;
wherein:
if each of said at least one solid state light emitter is illuminated and each of said at least one lumiphor is excited, a mixture of light exiting the lighting device that was emitted from said at least one solid state light emitter and light exiting the lighting device that was emitted from said at least one lumiphor would, in the absence of any additional light, have a mixed illumination having x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38, and said at least one lumiphor comprises phosphor particles, at least some of said phosphor particles having particle sizes in the range of from about 15 micrometers to about 25 micrometers, said lighting device, when supplied with electricity, emitting output light with a wall plug efficiency of at least 60 lumens per watt of said electricity.

31. A lighting device as recited in claim 30, wherein at least 50 weight percent of said phosphor particles have particle sizes in the range of from about 15 micrometers to about 25 micrometers.

32. A lighting device as recited in claim 30, wherein at least 75 weight percent of said phosphor particles have particle sizes in the range of from about 15 micrometers to about 25 micrometers.

33. A lighting device as recited in claim 30, wherein at least 90 weight percent of said phosphor particles have particle sizes in the range of from about 15 micrometers to about 25 micrometers.

34. A lighting device as recited in claim 30, wherein said phosphor particles have a mean particle size of about 20 micrometers.

35. A lighting device as recited in claim 30, wherein said at least one solid state light emitter comprises at least one light emitting diode.

36. A lighting device as recited in claim 35, wherein said at least one light emitting diode, if illuminated, would emit light having a peak wavelength in the range of from 430 nm to 480 nm.

37. A lighting device as recited in claim 30, wherein said at least one lumiphor, if excited, would emit light having a dominant wavelength in the range of from about 555 nm to about 585 nm.

38. A lighting device as recited in claim 30, further comprising at least a second solid state light emitter, wherein said second solid state light emitter is a light emitting diode which, if illuminated, would emit light having a dominant wavelength in the range of from 600 nm to 630 nm.

39. A lighting device comprising:
at least one solid state light emitter; and
at least one lumiphor;
wherein:
if each of said at least one solid state light emitter is illuminated and each of said at least one lumiphor is excited, a mixture of light exiting the lighting device that was emitted from said at least one solid state light emitter and light exiting the lighting device that was emitted from said at least one lumiphor would, in the absence of any additional light, have a mixed illumination having x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38, and said at least one lumiphor comprises phosphor particles, said phosphor particles having a mean particle size of about 5 micrometers, said lighting device, when supplied with electricity, emitting output light with a wall plug efficiency of at least 60 lumens per watt of said electricity.

40. A lighting device as recited in claim 39, wherein said at least one solid state light emitter comprises at least one light emitting diode.

41. A lighting device as recited in claim 40, wherein said at least one light emitting diode, if illuminated, would emit light having a peak wavelength in the range of from 430 nm to 480 nm.

42. A lighting device as recited in claim 39, wherein said at least one lumiphor, if excited, would emit light having a dominant wavelength in the range of from about 555 nm to about 585 nm.

43. A lighting device as recited in claim 39, further comprising at least a second solid state light emitter, wherein said second solid state light emitter is a light emitting diode which, if illuminated, would emit light having a dominant wavelength in the range of from 600 nm to 630 nm.

44. A lighting device comprising:
at least one solid state light emitter; and
at least one lumiphor;
wherein:
if each of said at least one solid state light emitter is illuminated and each of said at least one lumiphor is excited, a mixture of light exiting the lighting device that was emitted from said at least one solid state light emitter and light exiting the lighting device that was emitted from said at least one lumiphor would, in the absence of any additional light, have a mixed illumination having x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38, and said at least one lumiphor comprises phosphor particles, said phosphor particles having a mean particle size of about 10 micrometers, said lighting device, when supplied with electricity, emitting output light with a wall plug efficiency of at least 60 lumens per watt of said electricity.

45. A lighting device as recited in claim 44, wherein said at least one solid state light emitter comprises at least one light emitting diode.

46. A lighting device as recited in claim 45, wherein said at least one light emitting diode, if illuminated, would emit light having a peak wavelength in the range of from 430 nm to 480 nm.

47. A lighting device as recited in claim 44, wherein said at least one lumiphor, if excited, would emit light having a dominant wavelength in the range of from about 555 nm to about 585 nm.

48. A lighting device as recited in claim 44, further comprising at least a second solid state light emitter, wherein said second solid state light emitter is a light emitting diode which, if illuminated, would emit light having a dominant wavelength in the range of from 600 nm to 630 nm.

49. A lighting device comprising:
at least one solid state light emitter; and
at least one lumiphor;
wherein:
if each of said at least one solid state light emitter is illuminated and each of said at least one lumiphor is excited, a mixture of light exiting the lighting device that was emitted from said at least one solid state light emitter and light exiting the lighting device that was emitted from said at least one lumiphor would, in the absence of any additional light, have a mixed illumination having x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38, and
said at least one lumiphor comprises phosphor particles, said phosphor particles having a mean particle size of about 15 micrometers,
said lighting device, when supplied with electricity, emitting output light with a wall plug efficiency of at least 60 lumens per watt of said electricity.

50. A lighting device as recited in claim 49, wherein said at least one solid state light emitter comprises at least one light emitting diode.

51. A lighting device as recited in claim 50, wherein said at least one light emitting diode, if illuminated, would emit light having a peak wavelength in the range of from 430 nm to 480 nm.

52. A lighting device as recited in claim 49, wherein said at least one lumiphor, if excited, would emit light having a dominant wavelength in the range of from about 555 nm to about 585 nm.

53. A lighting device as recited in claim 49, further comprising at least a second solid state light emitter, wherein said second solid state light emitter is a light emitting diode which, if illuminated, would emit light having a dominant wavelength in the range of from 600 nm to 630 nm.

54. A lighting device comprising:
at least one solid state light emitter; and
at least one lumiphor;
wherein:
if each of said at least one solid state light emitter is illuminated and each of said at least one lumiphor is excited, a mixture of light exiting the lighting device that was emitted from said at least one solid state light emitter and light exiting the lighting device that was emitted from said at least one lumiphor would, in the absence of any additional light, have a mixed illumination having x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38, and
said at least one lumiphor comprises phosphor particles, said phosphor particles having a mean particle size of about 20 micrometers,
said lighting device, when supplied with electricity, emitting output light with a wall plug efficiency of at least 60 lumens per watt of said electricity.

55. A lighting device as recited in claim 54, wherein said at least one solid state light emitter comprises at least one light emitting diode.

56. A lighting device as recited in claim 55, wherein said at least one light emitting diode, if illuminated, would emit light having a peak wavelength in the range of from 430 nm to 480 nm.

57. A lighting device as recited in claim 54, wherein said at least one lumiphor, if excited, would emit light having a dominant wavelength in the range of from about 555 nm to about 585 nm.

58. A lighting device as recited in claim 54, further comprising at least a second solid state light emitter, wherein said second solid state light emitter is a light emitting diode which, if illuminated, would emit light having a dominant wavelength in the range of from 600 nm to 630 nm.

* * * * *